US006584605B1

(12) United States Patent
Zahar

(10) Patent No.: US 6,584,605 B1
(45) Date of Patent: Jun. 24, 2003

(54) METHOD FOR FORMING A RELATIVE PLACEMENT OF COMPONENTS OF AN INTEGRATED CIRCUIT USING A STRUCTURAL SIMILARITY GROUP

(75) Inventor: Sharon Zahar, San Jose, CA (US)

(73) Assignee: Sycon Design, Inc., Sunnyvale, CA (US)

( * ) Notice: Subject to any disclaimer, the term of this patent is extended or adjusted under 35 U.S.C. 154(b) by 0 days.

(21) Appl. No.: 09/293,500

(22) Filed: Apr. 15, 1999

(51) Int. Cl.[7] ................................................ G06F 17/50

(52) U.S. Cl. ................................................ 716/10; 716/9

(58) Field of Search ............................ 716/10, 8, 9, 11, 716/12, 13, 14, 2

(56) References Cited

U.S. PATENT DOCUMENTS

| | | | | |
|---|---|---|---|---|
| 5,519,627 A | * | 5/1996 | Mahmood et al. | 716/18 |
| 5,521,836 A | * | 5/1996 | Hartoog et al. | 716/10 |
| 5,659,484 A | | 8/1997 | Bennett et al. | 364/491 |
| 5,812,417 A | * | 9/1998 | Young | 716/9 |
| 5,838,583 A | * | 11/1998 | Varadarajan et al. | 716/9 |
| 5,841,663 A | * | 11/1998 | Sharma et al. | 716/18 |
| 6,145,117 A | * | 11/2000 | Eng | 716/18 |
| 6,286,128 B1 | | 9/2001 | Pileggi et al. | 716/18 |

OTHER PUBLICATIONS

Ienne et al, "Practical Experiences with Standard–Cell Based Datapath Design Tools, Do We Really Need Regular Layouts?," IEEE, Jun. 1998, pp. 396–401.*

Gordon et al, "An N–Bus Datapath Compiler for IC Design," IEEE, 1989, pp. 23.3.1–23.3.4.*

* cited by examiner

*Primary Examiner*—Vuthe Siek
(74) *Attorney, Agent, or Firm*—Haverstock & Owens LLP

(57) ABSTRACT

A method for forming a structural similarity group from a netlist for use in performing a relative placement of components of an integrated circuit is described. Also described are a method for forming a relative placement of components of an integrated circuit using a structural similarity group and a method for modifying a relative placement of components of an integrated circuit by analyzing adjacent components for shared resources. In addition, methods for determining bus line routing, control line routing, and cleanup line routing for components of an integrated circuit are described.

39 Claims, 24 Drawing Sheets

```
module adcomp (equalb, ina, inb);
   output equalb;
   input [10:0] ina;
   input [10:0] inb;
   wire [10:0] inab;
   wire [10:0] inbb;
   wire [10:0] na;
   wire [10:0] ncmp;
   wire ni;
   wire nnn;
   wire nx;
   wire ny;
   supply1 vdd;
sc_and4a xlil880 (.i3 (ncmp [4]), .i2 (ncmp [6]), .il (ncmp [5]), .i0 (ncmp [7]), .o(ny));
sc_and4a xlil902 (.i3 (ncmp [0]), .i2 (ncmp [2]), .il (ncmp [1]), .i0 (ncmp [3]), .o(nx));
sc_and4a xlil947 (.i3 (ncmp [8]), .i2 (ncmp [9]), .il (ncmp [10]), .i0 (vdd), .o(nnn));
sc_nor3b xlil953 (.i2 (nx), .il (ny), .i0 (nnn), .o (ni));
sc_inva xlil958 (.i0 (ina [10]), .o (inab [10]));
sc_inva xlil959 (.i0 (ina [9]), .o (inab [9]));
sc_inva xlil960 (.i0 (ina [8]), .o (inab [8]));
sc_inva xlil961 (.i0 (ina [7]), .o (inab [7]));
sc_inva xlil962 (.i0 (ina [6]), .o (inab [6]));
sc_inva xlil963 (.i0 (ina [5]), .o (inab [5]));
sc_inva xlil964 (.i0 (ina [4]), .o (inab [4]));
sc_inva xlil965 (.i0 (ina [3]), .o (inab [3]));
sc_inva xlil966 (.i0 (ina [2]), .o (inab [2]));
sc_inva xlil967 (.i0 (ina [1]), .o (inab [1]));
sc_inva xlil968 (.i0 (ina [0]), .o (inab [0]));
sc_inva xlil969 (.i0 (inb [10]), .o (inbb [10]));
sc_inva xlil970 (.i0 (inb [9]), .o (inbb [9]));
sc_inva xlil971 (.i0 (inb [8]), .o (inbb [8]));
sc_inva xlil972 (.i0 (inb [7]), .o (inbb [7]));
```

*Fig. 2A*

```
sc_inva xlil973 (.i0(inb [6]), .o(inbb[6]));
sc_inva xlil974 (.i0(inb [5]), .o(inbb[5]));
sc_inva xlil975 (.i0(inb [4]), .o(inbb[4]));
sc_inva xlil976 (.i0(inb [3]), .o(inbb[3]));
sc_inva xlil977 (.i0(inb [2]), .o(inbb[2]));
sc_inva xlil978 (.i0(inb [1]), .o(inbb[1]));
sc_inva xlil979 (.i0(inb [0]), .o(inbb[0]));
sc_mux2i xlil980 (.il(inb[10]), .i0(na[10]), .o(inbb[10]), .s0(ina[10]));
sc_mux2i xlil981 (.il(inb[9]), .i0(na[9]), .o(inbb[9]), .s0(ina[9]));
sc_mux2i xlil982 (.il(inb[8]), .i0(na[8]), .o(inbb[8]), .s0(ina[8]));
sc_mux2i xlil983 (.il(inb[7]), .i0(na[7]), .o(inbb[7]), .s0(ina[7]));
sc_mux2i xlil984 (.il(inb[6]), .i0(na[6]), .o(inbb[6]), .s0(ina[6]));
sc_mux2i xlil985 (.il(inb[5]), .i0(na[5]), .o(inbb[5]), .s0(ina[5]));
sc_mux2i xlil986 (.il(inb[4]), .i0(na[4]), .o(inbb[4]), .s0(ina[4]));
sc_mux2i xlil987 (.il(inb[3]), .i0(na[3]), .o(inbb[3]), .s0(ina[3]));
sc_mux2i xlil988 (.il(inb[2]), .i0(na[2]), .o(inbb[2]), .s0(ina[2]));
sc_mux2i xlil989 (.il(inb[1]), .i0(na[1]), .o(inbb[1]), .s0(ina[1]));
sc_mux2i xlil990 (.il(inb[0]), .i0(na[0]), .o(inbb[0]), .s0(ina[0]));
sc_invb x1i1991 (.i0(na[10]), .o(ncmp [10]));
sc_invb x1i1992 (.i0(na[9]), .o(ncmp[9]));
sc_invb x1i1993 (.i0(na[8]), .o(ncmp[8]));
sc_invb x1i1994 (.i0(na[7]), .o(ncmp[7]));
sc_invb x1i1995 (.i0(na[6]), .o(ncmp[6]));
sc_invb x1i1996 (.i0(na[5]), .o(ncmp[5]));
sc_invb x1i1997 (.i0(na[4]), .o(ncmp[4]));
sc_invb x1i1998 (.i0(na[3]), .o(ncmp[3]));
sc_invb x1i1999 (.i0(na[2]), .o(ncmp[2]));
sc_invb x1i2000 (.i0(na[1]), .o(ncmp[1]));
sc_invb x1i2001 (.i0(na[0]), .o(ncmp[0]));
sc_invb x1i2003 (.i0(ni), .o(equalb));
```

(In Verilog format)

*Fig. 2A (cont'd)*

```
ina     : 0-10 : 0-10 : INPUT
inb     : 0-10 : 0-10 : INPUT
inab    : 0-10 : 0-10 : Internal Bus
inbb    : 0-10 : 0-10 : Internal Bus
na      : 0-10 : 0-10 : Internal Bus
ncmp    : 0-10 : 0-10 : Internal Bus
```

*Fig. 2B*

```
vdd  internal
equalb  right
nnn  internal
ni  internal
nx  internal
ny  internal
```

*Fig. 2C*

```
str0 : 0-10 : x1i1968 x1i1967 x1i1966 x1i1965 x1i1964 x1i1963 x1i1962 x1i1961 x1
str2 : 0-10 : x1i1990 x1i1989 x1i1988 x1i1987 x1i1986 x1i1985 x1i1984 x1i1983 x1
str1 : 0-10 : x1i1979 x1i1978 x1i1977 x1i1976 x1i1975 x1i1974 x1i1973 x1i1972 x1
str3 : 0-10 : x1i2001 x1i2000 x1i1999 x1i1998 x1i1997 x1i1996 x1i1995 x1i1994 x1
```

*Fig. 2D*

| | B0 | B1 | B2 | B3 | B4 | B5 | B6 |
|---|---|---|---|---|---|---|---|
| C2 | A | D | C | I | G | J | L |
| C1 | S | Q | R | K | T | M | N |
| C0 | H | W | B | F | O | P | E |

*Fig. 5A*

| | B0 | B1 | B2 | B3 | B4 | B5 | B6 |
|---|---|---|---|---|---|---|---|
| C2 | | | | | | | |
| C1 | | | | | | | |
| C0 | A | D | | | | | |

*Fig. 5B*

| | B0 | B1 | B2 | B3 | B4 | B5 | B6 |
|---|---|---|---|---|---|---|---|
| C2 | | | | | P | E | |
| C1 | S | Q | R | | | | |
| C0 | A | D | | | G | J | L |

*Fig. 5C*

| | B0 | B1 | B2 | B3 | B4 | B5 | B6 |
|---|---|---|---|---|---|---|---|
| C2 | H | W | | | P | E | |
| C1 | S | Q | R | | T | M | N |
| C0 | A | D | | | G | J | L |

*Fig. 5D*

| | B0 | B1 | B2 | B3 | B4 | B5 | B6 |
|---|---|---|---|---|---|---|---|
| C2 | A | D | | | G | J | L |
| C1 | S | Q | R | | T | M | N |
| C0 | H | W | | | P | E | |

*Fig. 5E*

| | B0 | B1 | B2 | B3 | B4 | B5 | B6 |
|---|---|---|---|---|---|---|---|
| C2 | A | D | C | I | G | J | L |
| C1 | S | Q | R | K | T | M | N |
| C0 | H | W | B | F | P | E | O |

METHOD FOR FORMING A RELATIVE PLACEMENT OF COMPONENTS OF AN INTEGRATED CIRCUIT USING A STRUCTURAL SIMILARITY GROUP

BACKGROUND OF THE INVENTION

1. Field of the Invention

The invention generally relates to processes for determining a layout for an integrated circuit from a netlist representing the circuit.

2. Description of Related Art

The rapid transition to a very deep submicro (VDSM) silicon process has created a significant demand for a change in design practices within the integrated circuit (IC) community. As process geometries are getting smaller, the functionality that can be packed onto a single chip is increasing. The VDSM process enables designs measured in tens of millions of transistors. As the complexity of integrated circuits increases, the time required to lay out the circuity is dramatically increasing. To handle this level of complexity, designers are moving rapidly to a structured, hierarchical design implementation.

Full-custom integrated circuit layout is one of the last frontiers to be conquered by automation and is required to meet the increasing demands being made on custom designers. There is a need for tools to reduce design time for full custom blocks from months to weeks and even days, while maintaining the quality and performance of manual designs.

Furthermore, the time is rapidly approaching when manual full-custom integrated circuit layout schedules and time-to-market demands will be colliding. As consumer applications become the primary customer for the integrated circuit industry, time-to-market and design costs will be the primary design constraints. High quality automated layout solutions are needed to compete in this new consumer application environment.

While time-to-market concerns is rapidly becoming a critical design parameter, layout optimization in regard to area and performance remains critical. A need still exists for high quality automated layout solutions which can achieve compaction and performance levels that meet or exceed those achievable by manual layout.

Current automation tools appear to be cell-centric, regardless of the fact that interconnect parasitics dominate performance in deep sub-micron designs. As a further layer of impediment to the automation process, universal libraries are forced upon all designs, compromising area, timing, and power. Interconnect problems are dealt with in a reactive mode, since the automation or manual mentality provides minimal capability for interactive improvements.

A need therefore exists for an automated design tool that can produce integrated circuits with the density and performance of manual "full custom" design, and with the time to market and design throughput of the most efficient "semi-custom" design. These and other needs are addressed by the methods of the present invention.

SUMMARY OF THE INVENTION

A computer implemented method is provided for forming a structural similarity group from a netlist of an integrated circuit comprising:

- taking a netlist representation of components forming all or part of an integrated circuit;
- forming groups of the components included in the netlist representation which have at least a selected degree of structural similarity between each other; and
- forming a structural similarity group which includes those groups of components identified as having at least the selected degree of structural similarity.

A computer implemented method is also provided for forming a relative placement of components of an integrated circuit from a netlist comprising:

- taking a netlist representation of components forming all or part of an integrated circuit;
- forming groups of components within the netlist which have at least a selected degree of structural similarity between each other, those components within the netlist which do not have at least the selected degree of structural similarity being omitted from the groups of components formed;
- performing an initial relative placement of the groups of components;
- reducing wire lengths between components of initial relative placement; and
- adding to the relative placement those components from the netlist which were not included in the groups of components.

A computer implemented method is also provided for modifying a relative placement of components of an integrated circuit comprising:

- taking a relative placement of components of an integrated circuit;
- analyzing adjacent components for resources associated with the components which can be shared; and
- modifying the relative placement of components such that adjacent components share identified sharable resources.

A computer implemented method is also provided for determining at least part of a bus line routing for each bus line of an integrated circuit, each bus line routing including an initial routing and a cleanup routing, the method comprising:

- taking a finalized relative placement of components of the integrated circuit, the placement including routing constraints and at least a first and second port locations associated with each bus line;
- determining a routing order for the bus lines based on at least one criterion; and
- determining an initial routing for each bus line based on the placement, each initial routing being substantially straight and substantially parallel to a bus line axis, a length of each initial routing based on a distance along the bus line axis between the first and second port locations, a position of each initial routing based on an average distance orthogonal to the bus line axis between at least the first and second port locations, wherein the placement is unaltered.

A computer implemented method is also provided for determining at least a part of a control line routing for each control line of an integrated circuit, each control line routing including an initial routing and a cleanup routing, the method comprising:

- taking a finalized relative placement of components of the integrated circuit, the placement including routing constraints and at least a first and second port locations associated with each control line; and
- determining an initial routing for each control line based on the placement, each initial routing being substantially straight and substantially parallel to a control line axis, a length of each initial routing based on a distance along the control line axis between the first and second port locations, a position of each initial routing based on an average distance orthogonal to the control line axis between at least the first and second port locations, wherein the placement is unaltered.

A computer implemented method is also provided for determining a cleanup line routing for a bus line or control line of an integrated circuit, the method comprising:

taking a finalized relative placement of components of the integrated circuit, the placement including routing constraints and port locations;

taking an initial routing for each bus line or control line; and determining a cleanup line routing for each bus line or control line based on the placement and the initial routing, the cleanup line routing connecting the initial routing for each bus line or control line to ports associated with each bus line or control line.

An article of manufacture comprising a computer readable medium bearing a program code embodied therein for performing the above method and an integrated circuit design tool comprising: a processor; and memory coupled to the processor including instructions which when executed by the processor perform the above methods are also provided by the present invention.

BRIEF DESCRIPTION OF THE DRAWINGS

FIG. 2A illustrates a netlist including representations of components of a circuit.

FIG. 2B illustrates a bus line group based on the netlist shown in FIG. 2A.

FIG. 2C illustrates a control line group based on the netlist shown in FIG. 2A.

FIG. 2D illustrates a structural similarity group based on the netlist shown in FIG. 2A.

FIG. 5A illustrates a bus/control line positioning template formed based on the bus line order specified in the netlist.

FIG. 5B illustrates the placement of the AD group of components from the structural similarity group in bus line tracks B0 and B1.

FIG. 5C illustrates the placement of additional groups of components from the structural similarity group to the bus line tracks.

FIG. 5D illustrates the placement of the remaining components from the structural similarity group to the bus line tracks.

FIG. 5E illustrates the result of performing a minimum cut algorithm upon the initial placement of the components of FIG. 5D.

FIG. 5F represents an 8-bit adder circuit representation after having the circuit design optimized according to a method of a present invention.

DETAILED DESCRIPTION OF THE INVENTION

Figure 1:
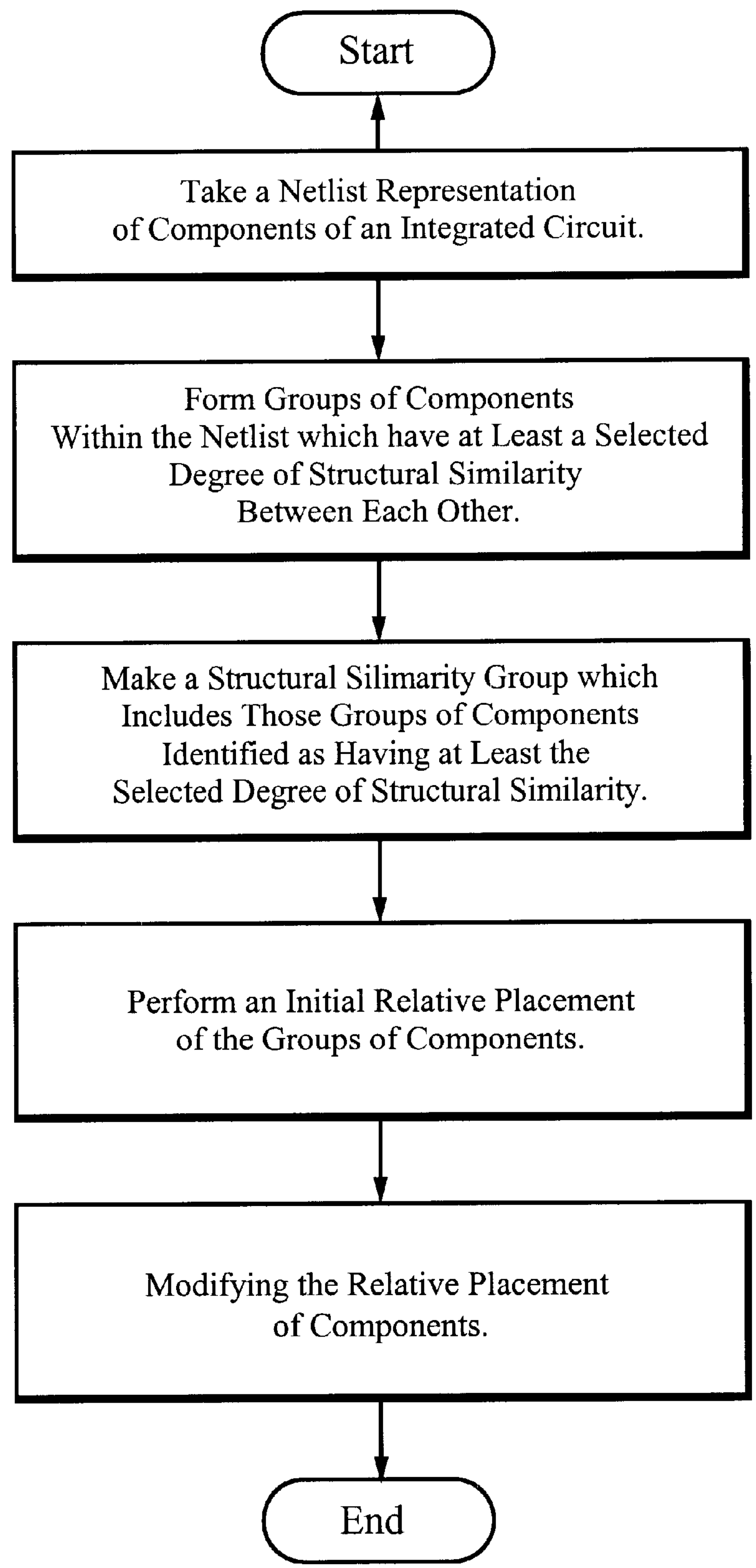
FIG. 1 illustrates a flow diagram for a method of taking a netlist and forming a relative placement of the components of the circuit.

The present invention relates to a series of methods employable in the overall process of taking a netlist representation of components of an integrated circuit and designing an integrated circuit layout including a placement scheme for the components forming the circuit and a routing scheme for the circuit. These different methods may be employed alone or in combination with other methods of the present invention.

One of the methods provided by the present invention is for forming a structure group from a netlist of components of an integrated circuit, the structure group being useful for later performing a relative placement of the components forming the circuit. In one embodiment, the method comprises: taking a netlist representation of components of an integrated circuit; forming groups of the components included in the netlist representation which have at least a selected degree of structural similarity between each other; and forming a structural similarity group which includes those groups of components identified as having at least the selected degree of structural similarity. This structure group is used in the method for performing a relative placement of the components.

An article of manufacture comprising a computer readable medium bearing a program code embodied therein for performing the above method and an integrated circuit design tool comprising: a processor; and memory coupled to the processor including instructions which when executed by the processor perform the above methods are also provided by the present invention.

As used herein, structural similarity includes similarities between different components based on which bus lines and control lines each component is connected to in the circuit. Other structural features may also be used in determining a degree of structural similarity including buses, controls, nets, component types, power requirements, cell equivalents, and the like. The degree of structural similarity may refer to a ratio between the number of structural features which two components have in common and the total number of structural features used to evaluate structural similarity. Typically, the component with the most structural features is placed in the denominator and the number of structural features which that component shares with a second component is placed in the numerator of the ratio. Alternatively, a degree of similarity may refer to a number of structural features which two components have in common. The term "selected degree" refers to the degree of structural similarity required to be included in the list. It is noted that the degree of structural similarity may be selected by the user. Hence, a user may select between different degrees of structural similarity (e.g., at least 10%, 20%, 25%, 33%, 50%, 66%, 75%, 80%, or 100% structural similarity).

The groups of structurally similar components formed may be required to have a minimum number of components, e.g., 2, 3, 4 or more. Also, a limit may be set for the maximum number of components that can be included in a group. This maximum number may correspond to a maximum bus line width for the integrated circuit being laid out.

Another method provided is for forming a relative placement of components of an integrated circuit from a netlist using a structure group. FIG. 1 illustrates a flow diagram for one embodiment of the method. As illustrated in the figure, the method comprises: taking a netlist representation of components of an integrated circuit; forming groups of components within the netlist which have at least a selected degree of structural similarity between each other; making a structural similarity group which includes those groups of components identified as having at least the selected degree of structural similarity; performing an initial relative placement of the groups of components; modifying the relative placement of components relative to control lines such that wire lengths between components are minimized; and adding to the relative placement those components from the netlist which were not included in the groups of components.

An article of manufacture comprising a computer readable medium bearing a program code embodied therein for performing the above method and an integrated circuit design tool comprising: a processor; and memory coupled to the processor including instructions which when executed by the processor perform the above method is also provided by the present invention.

An important aspect of this method is the concept of taking a group of components included in a netlist and forming a subgroup of components corresponding to those components which have a selected degree of structural similarity with at least one other component in the circuit. Components of the circuit which do not satisfy the selected degree of similarity requirement are not used while an initial relative placement of the grouped components is performed, thereby reducing the complexity of that placement. The components that are set aside during this initial relative placement due to lack of sufficient structural similarity may be readily placed after the initial relative placement.

A relative order for bus lines in the circuit is generally specified by the circuit designer and can be found in the netlist. According to a variation of the above method, the relative order for the bus lines specified in the netlist is preserved throughout the relative placement. Accordingly, the step of performing an initial relative placement of the groups of components includes placing the groups of components such that the relative order for the bus lines specified in the netlist is preserved. The step of reducing wire lengths between components of initial relative placement is performed with regard to the control lines. The order of the bus lines is preserved during this process.

By preserving the order of the bus lines specified in the netlist during the process, integrated circuits can be designed where the different bus lines in the circuit are substantially straight and have substantially the same length. Also, by preserving the order of the bus lines, the timing of signals reaching components on different bus lines which perform the same functions can be made to be substantially the same because the length of each bus line is the same length. Having substantially the same timing on different bus lines enables there to be relatively zero displacement between the timing of an operation on a first bus line and an operation on a second, different bus line in circuits designed according to the present invention. Use of the process also enables integrated circuits to be designed where the length of the bus lines in the circuit is minimized. This enables the resulting integrated circuit to have improved processing speed and eliminates the need for deconvolution.

Further according to the above method, relative placements may be performed such that a relative placement of a group of structurally similar components is performed. Then, whenever a group of the same components is identified, the relative placement that had been determined for that group of components is utilized, thereby reducing the need to perform multiple redundant relative placements and improving the rate at which a relative placement of an entire circuit can be performed.

Further according to the above method, the step of adding to the relative placement those components from the netlist which were not included in the groups of components is preferably performed iteratively where each component is placed such that cut and wire lengths between components are minimized.

Another method provided is for modifying a relative placement of components of an integrated circuit based on an analysis of adjacent components for shared resources. One embodiment of this method comprises: taking a relative placement of components of an integrated circuit; analyzing adjacent components for resources associated with the components which can be shared; and modifying the relative placement of components such that adjacent components share identified sharable resources. An integrated circuit design tool comprising: a processor; and logic for performing the above method is also provided by the present invention.

Another method that is provided is for determining at least part of a bus line routing for each bus line of an integrated circuit, each bus line routing including an initial routing and a cleanup routing. One embodiment of the method includes taking a finalized relative placement of components of the integrated circuit, the placement including routing constraints and at least a first and second port locations associated with each bus line; determining a routing order for the bus lines based on at least one criterion; and determining an initial routing for each bus line based on the placement, each initial routing being substantially straight and substantially parallel to a bus line axis, a length of each initial routing based on a distance along the bus line axis between the first and second port locations, a position of each initial routing based on an average distance orthogonal to the bus line axis between at least the first and second port locations, wherein the placement is unaltered.

An article of manufacture comprising a computer readable medium bearing a program code embodied therein for performing the above method and an integrated circuit design tool comprising: a processor; and memory coupled to the processor including instructions which when executed by the processor perform the above method is also provided by the present invention.

Another method that is provided is for determining at least a part of a control line routing for each control line of an integrated circuit, each control line routing including an initial routing and a cleanup routing. One embodiment of the method includes taking a finalized relative placement of components of the integrated circuit, the placement including routing constraints and at least a first and second port locations associated with each control line; and determining an initial routing for each control line based on the placement, each initial routing being substantially straight and substantially parallel to a control line axis, a length of each initial routing based on a distance along the control line axis between the first and second port locations, a position of each initial routing based on an average distance orthogonal to the control line axis between at least the first and second port locations, wherein the placement is unaltered.

An article of manufacture comprising a computer readable medium bearing a program code embodied therein for performing the above method and an integrated circuit design tool comprising: a processor; and memory coupled to the processor including instructions which when executed by the processor perform the above method is also provided by the present invention.

Another method that is provided is for determining a cleanup line routing for a bus line or control line of an integrated circuit. One embodiment of the method includes taking a finalized relative placement of components of the integrated circuit, the placement including routing constraints and port locations; taking an initial routing for each bus line or control line; and determining a cleanup line routing for each bus line or control line based on the placement and the initial routing, the cleanup line routing connecting the initial routing for each bus line or control line to ports associated with each bus line or control line.

An article of manufacture comprising a computer readable medium bearing a program code embodied therein for performing the above method and an integrated circuit design tool comprising: a processor; and memory coupled to the processor including instructions which when executed by the processor perform the above method is also provided by the present invention.

An important aspect of this method is that routings between components are created by connecting each component to an adjacent bus line or control line, as opposed to creating routings directly between components. By utilizing bus lines and control lines to route between components, the total route length between different components is reduced.

Each of the above methods will now be described in greater detail below.

1. Method for Forming a Structural Similarity Group From A Netlist for Use In Performing a Relative Placement of Components of an Integrated Circuit A netlist refers to list of representations of components forming all or part of an integrated circuit. The representations may include a variety of symbolic representations which are used to describe the components of the circuit. These symbolic representations typically include an identification of the type of component and their interconnections, for example, symbolic representations of the bus line and control line connections for each component. Examples of additional symbolic representations that may be included in a netlist representation include, but are not limited to regular nets, component types, and connectivities.

FIG. 2A illustrates a netlist including representations of components of a circuit. As illustrated, the netlist provides a list of components (and=and gates; nor=nor gates; mux=multiplexers; and inv=inverters). For each component, a list is provided of the bus lines (ina, inb, inab, inbb, na, ncmp) and control lines (vdd, eualb, nnn, ni, nx, ny) to which the component is connected. The netlist also provides an initial order for the bus lines (ina, inb, inab, inbb, na, ncmp).

According to one method of the present invention, a netlist, such as the one illustrated in FIG. 2A, is analyzed for the presence of different structural requirements in order to form structure groups which are later used to perform a relative placement of the components listed in the netlist. Each structure group includes representations of how the netlist representations satisfy the structural requirement used to form the structure group.

A variety of different structural requirements may be used to form the structure groups. Examples of different structural requirements that may be used include, but are not limited to, whether a component is connected to a particular bus line or group of bus lines, whether a component is connected to a particular control line or group of control lines, and whether there is a degree of structural similarity between two or more components regarding their connectivity to different bus lines, control lines and other components.

FIG. 2B illustrates a bus line group based on the netlist shown in FIG. 2A. As illustrated, the bus line group lists the different bus lines in the initial order provided in the netlist.

FIG. 2C illustrates a control line group based on the netlist shown in FIG. 2A.

As described above, structural similarity refers to similarities between different components based on which bus lines and control lines each component is connected to in the circuit. Other structural features may also be used in determining a degree of structural similarity including buses, controls, nets, component types, and connectivities to other structures. A degree of similarity generally refers to a ratio between the number of structural features which two components share in common and the total number of structural features used to evaluate structural similarity. Alternatively, a degree of similarity may refer to a number of structural features which two components have in common. Optionally, certain forms of structural similarity, such as common bus line or control line connectivity, may be given greater significance than other forms of structural similarity.

The degree of structural similarity required to satisfy the list may be selectable by the user. For example, a user may select between different degrees of structural similarity (e.g., at least 10%, 20%, 25%, 33%, 50%, 66%, 75%, 80%, or 100% structural similarity).

FIG. 2D illustrates a structural similarity group based on the netlist shown in FIG. 2A where it is required that components have at least 100% structural similarity. In forming the structural similarity group, it was required that the components appear in both the bus line and control line constraint lists.

As will be explained herein in greater detail, the structural similarity constraint list is used to divide the netlist into a first group of components which have a specified degree of structural similarity with at least one or more other components, and a second group of components which do not have the specified degree of structural similarity with a sufficient number of other components in the netlist. The first group which satisfy the structural similarity requirements are used to perform an initial relative placement of components. During this initial relative placement, the second group which lack sufficient structural similarity to be included in the group are not placed. By dividing the components in the netlist into this first and second group of components, the complexity of creating an initial relative placement is reduced. Also, the formation of these two groups insures that components with the highest degree of structural similarity are given priority when determining a relative placement.

While the above method is described with regard to creating a single structural similarity group, it is noted that it may be desirable to form a group with a high degree of structural similarity, and one or more other groups which have a lower degree of structural similarity. This allows one to have multiple levels of prioritization in creating a relative placement of components.

Figure 3:
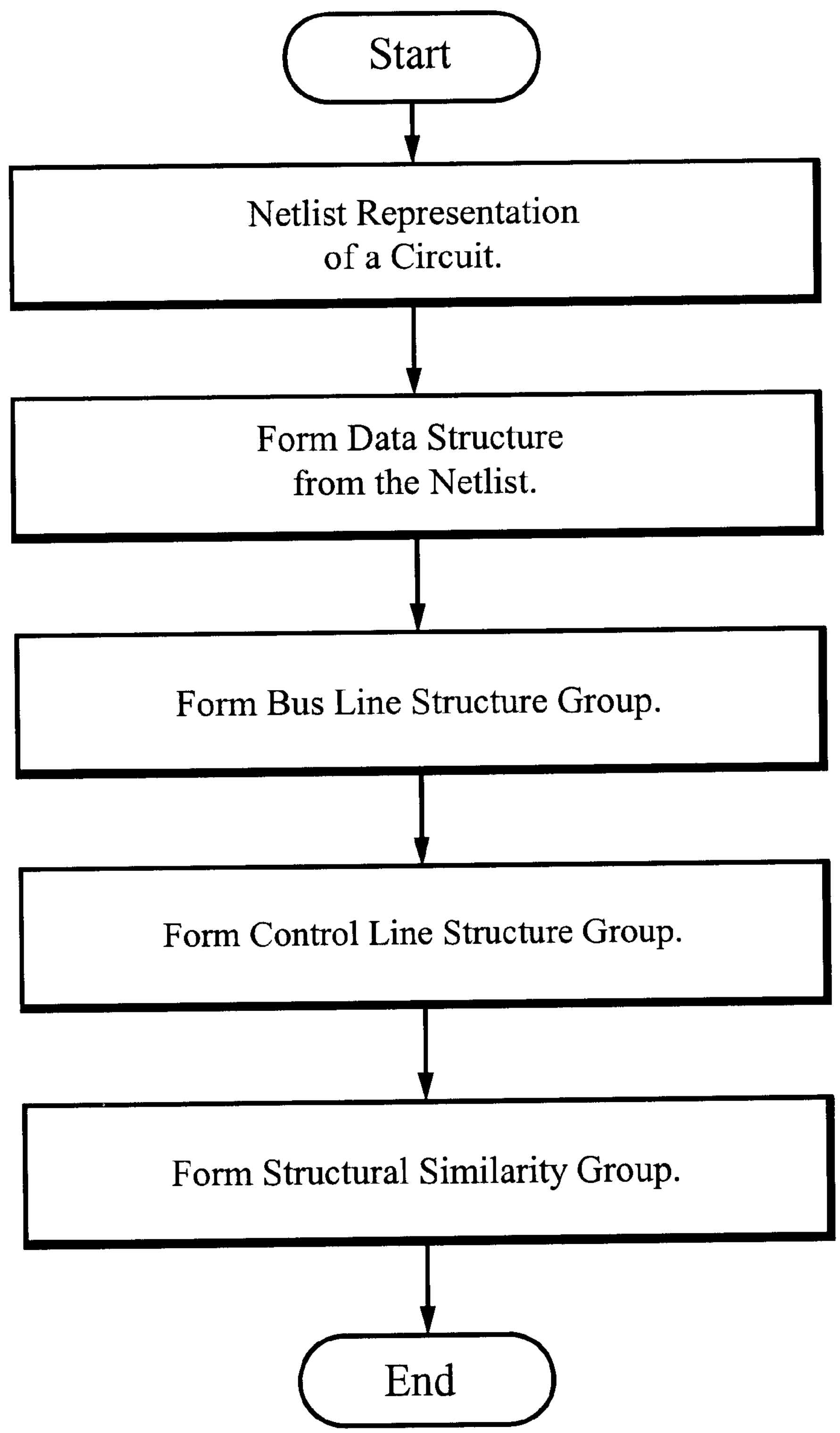
FIG. 3 illustrates an example of a process flow for forming structure groups from a netlist.

FIG. 3 illustrates an example of a process flow for forming structure groups from a netlist. As illustrated, the process includes the step of taking a netlist and building a data structure which includes components, bus lines, and control lines. The data structure may optionally further include additional information about the circuit and its components.

A group of structure lines is generated for each bus line based on those components on the same bus line.

A group of structure lines is also generated for each control line based on those components on the same control line. For each control line, a maximum control line component length may be specified. As structure lines are generated, control lines having a length equal to or shorter than the control line component maximum length may be allowed to be formed. Those structure lines having a length greater than the control line component maximum length may be discarded.

A group of structure lines based on structural similarity may also be formed. In this flow, different bits of the same bus are considered to be the same connection.

2. Method for Forming a Relative Placement of Components of an Integrated Circuit Using a Structural Similarity Group Another method provided is for forming a relative placement of components of an integrated circuit from a netlist using a structural similarity group. As described in Section 1, one or more structure groups may be formed from a netlist. This method may be applied to all or a portion of an integrated circuit. The method can also be used to enhance the placement of components of an integrated circuit, regardless of the circuit's origin, as long as structure groups are provided as described above.

In one embodiment, the method comprises: taking a netlist representation of components of an integrated circuit; forming groups of components within the netlist which have at least a selected degree of structural similarity between each other; making a structural similarity group comprising those groups of components identified as having at least the selected degree of structural similarity; performing an initial relative placement of the groups of components; modifying the relative placement of components relative to control lines such that wire lengths between components are minimized; and adding to the relative placement those components from the netlist which were not included in the groups of components.

In general, a netlist includes representations for N components which correspond to all or part of an integrated circuit. The structural similarity group formed in Section 1 above includes M components, wherein M<N. Those components from the netlist which are not included in the structural similarity group lo are N−M in number. The relative placement method described in this section allows for the relative placement of N components to be performed in at least two stages where M components (those components from the netlist which appear in the structural similarity group) are placed and then N−M components are placed (those components from the netlist which do not appear in the structural similarity group).

An important aspect of this method is the concept of taking a group of components included in a netlist and forming a subgroup of components corresponding to those components which have a selected degree of structural similarity with at least one other component in the circuit. Components of the circuit which do not satisfy the selected degree of similarity requirement are not used while an initial relative placement of the grouped components is performed, thereby reducing the complexity of that placement. The components that are set aside during this initial relative placement due to lack of sufficient structural similarity may be readily placed after the initial relative placement.

A relative order for bus lines in the circuit is generally specified by the circuit designer and can be found in the netlist. According to a variation of the above method, the relative order for the bus lines specified in the netlist is preserved throughout the relative placement. Accordingly, the step of performing an initial relative placement of the groups of components includes placing the groups of components such that the relative order for the bus lines specified in the netlist is preserved. The step of reducing wire lengths between components of initial relative placement is performed with regard to the control lines. The order of the bus lines is preserved during this process.

By preserving the order of the bus lines specified in the netlist during the process, integrated circuits can be designed where the different bus lines in the circuit are substantially straight and have substantially the same length. Also, by preserving the order of the bus lines, the timing on different bus lines is substantially the same, because the length of each bus line is substantially the same. Having substantially the same timing on different bus lines enables there to be relatively zero displacement between the timing of an operation on a first bus line and an operation on a second, different bus line in circuits designed according to the present invention. Use of the process also enables integrated circuits to be designed where the length of the bus lines in the circuit is minimized. This enables the resulting integrated circuit to have improved processing speed and eliminates the need for deconvolution.

Furthermore, according to the above method, the step of adding to the relative placement those components from the netlist which were not included in the groups of components is preferably performed iteratively where each component is placed such that cut and wire lengths between components are minimized.

The above method will now be described in more detail with references to FIGS. 4, 5A–5F, and 6A–6C.

Figure 4:
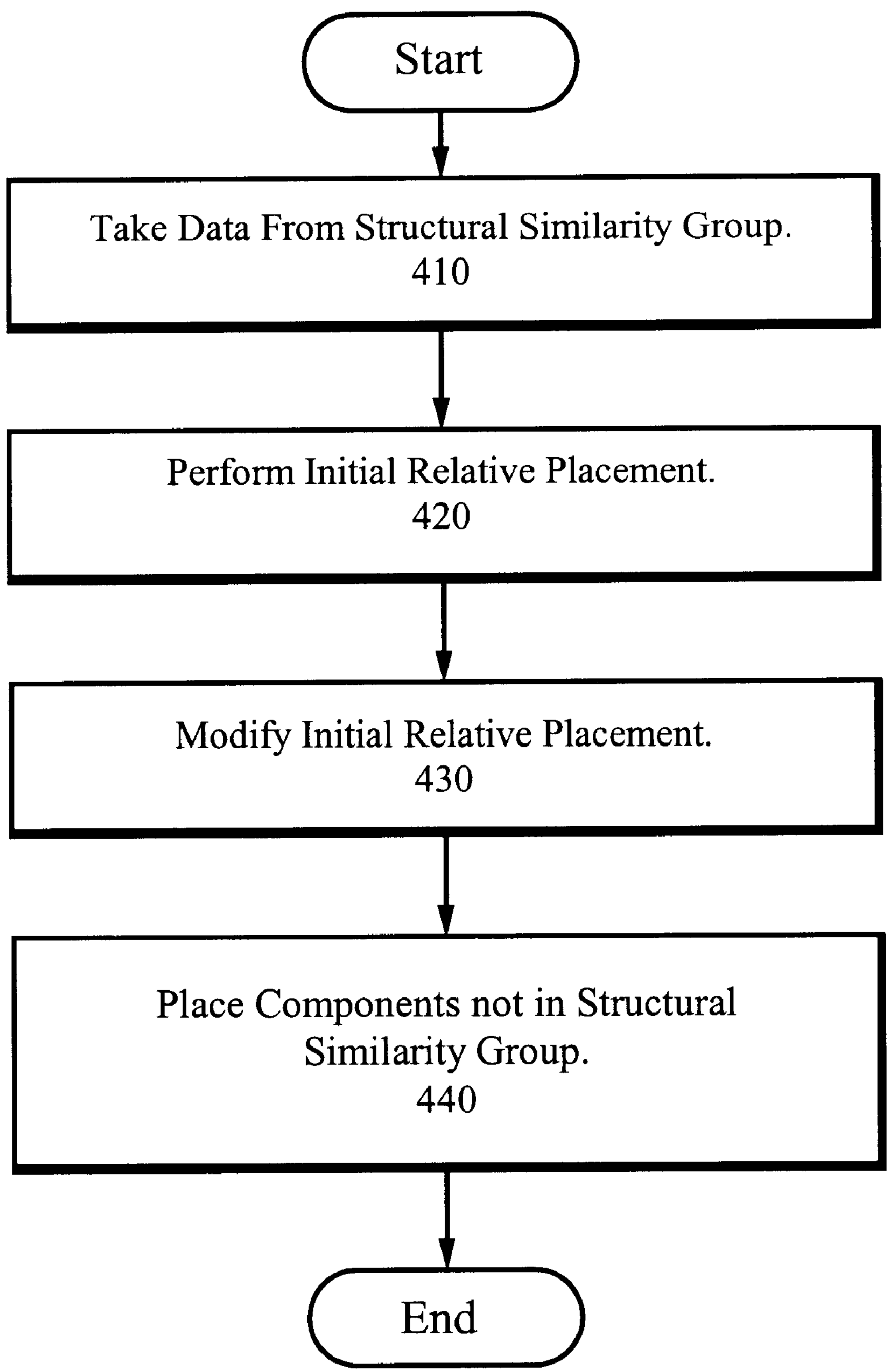
FIG. 4 illustrates an embodiment of a flow diagram for performing an initial placement according to the present invention.

FIG. 4 illustrates a flow diagram of the method for performing a relative placement of components using a structure group. This method may be incorporated into a software program and run on a processor (not shown) in order to determine a relative placement. In step 410, data from the structural similarity group is taken and in step 420, the data is used to perform an initial relative placement (See FIG. 1).

Figures 5A, 5B, 5C:
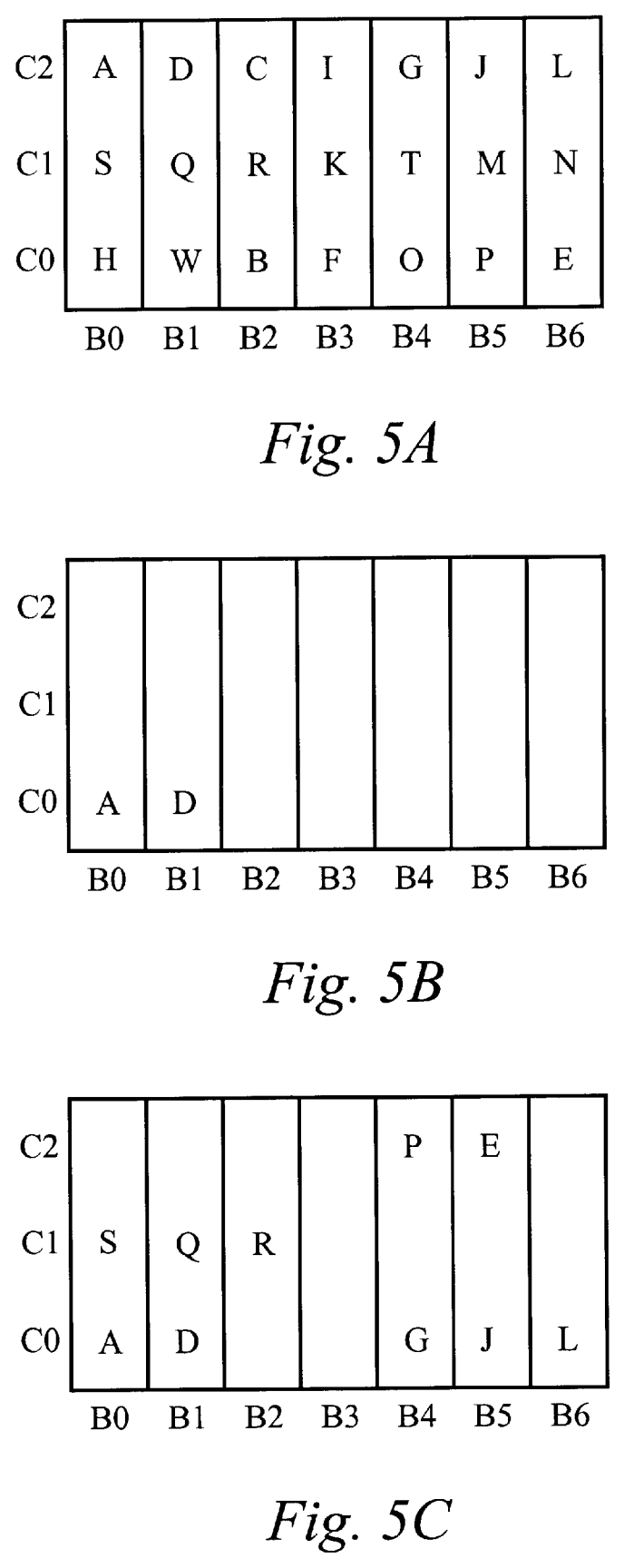

FIGS. 5A–5F illustrate an embodiment of an initial relative placement step. As illustrated in FIG. 5A, a bus/control line positioning template is formed based on the bus line order specified in the netlist. The bus/control positioning template is used as a backdrop for placing the components in positions relative to each other and in the vicinity of where the bus and control lines will be ultimately placed. After all of the components have been placed, bus and control lines are actually positioned (See Sections 4 and 5).

As described above, a relative order for bus lines in the circuit is generally specified by the circuit designer and can be found in the netlist. This relative order of bus lines is preferably conserved in the bus/control positioning template. It should be noted that in this representation that only a few control lines are illustrated but in an actual application the number of buses and control lines can range from several to hundreds of thousands.

As illustrated in FIG. 5A, reference numerals B0–B6 are positioned along the x-axis and identify the zero bit through second bit bus line regions wherein the zero bit through second bit bus lines will be ultimately positioned. The reader should note that in FIGS. 5A–5F the final placement of the bus lines will be parallel to the y-axis, i.e. the bus lines run from top to bottom in this illustration. Along the x-axis the reference numerals C0–C2 represent the zero through second control line regions of a portion of the bus/control line positioning template. As illustrated in FIG. 5B, the AD group of components from the structural similarity group introduced in FIG. 1 is placed in bus line tracks B0 and B1 to which the component group was associated in the netlist. As illustrated in FIGS. 5C and 5D, this process is repeated until all of the groups of components are included in the initial relative placement.

Further according to the above method, relative placements may be performed such that a relative placement of a group of structurally similar components is performed. Then, whenever a group of the same components is identified, the relative placement that had been determined for that group of components is utilized, thereby reducing the need to perform multiple redundant relative placements and improving the rate at which a relative placement of an entire circuit can be performed.

For example, FIG. 5F represents an 8-bit adder circuit representation after having the circuit design optimized according to a method of the present invention. As additional 8-bit adder circuits are identified within the circuit, the already determined structure for an 8-bit adder circuit can be utilized again and again. As a result, the structure of component groups, such as an 8-bit adder circuit, can be determined once and used over and over again. Of course the additional 8-bit adder circuits may have different control and bus lines, but these differences are taken care of in the netlist.

By employing duplication of the structures and their placement, the present invention promotes uniformity in IC design, thereby enabling structures to have substantially the same timing on different bits of the same bus, minimization of the length of the bus lines in the circuit, and improved processing speed. In addition, the processing time required to design the circuit is significantly reduced.

Referring back to FIG. 4, one of many conventional algorithms may be performed in step 430 to reduce wire lengths between components of initial relative placement. For example, minimum cut algorithm may be used to analyze the placement of the components to minimize the number of line cuts and wire length of the bus line such that both are minimized.

Figure 6A:
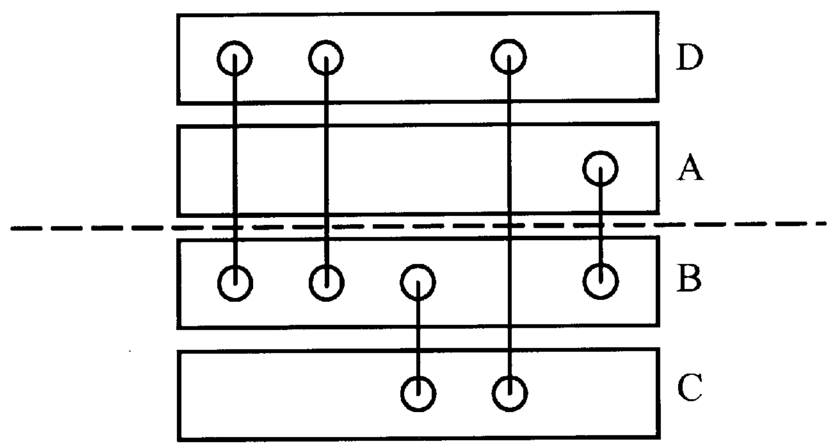
FIG. 6A illustrates an initial relative placement of components and their connectivities.
Figure 6B:
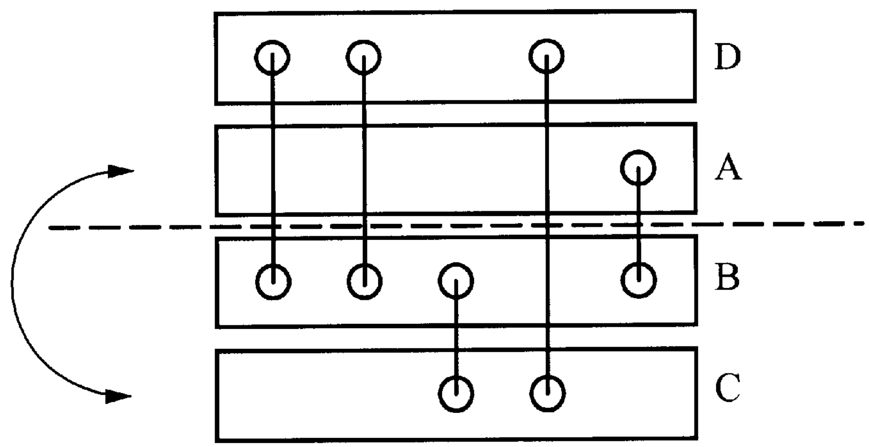
FIG. 6B illustrates the performance of a minimum cut algorithm on the initial relative placement of components illustrated in FIG. 6A.
Figure 6C:
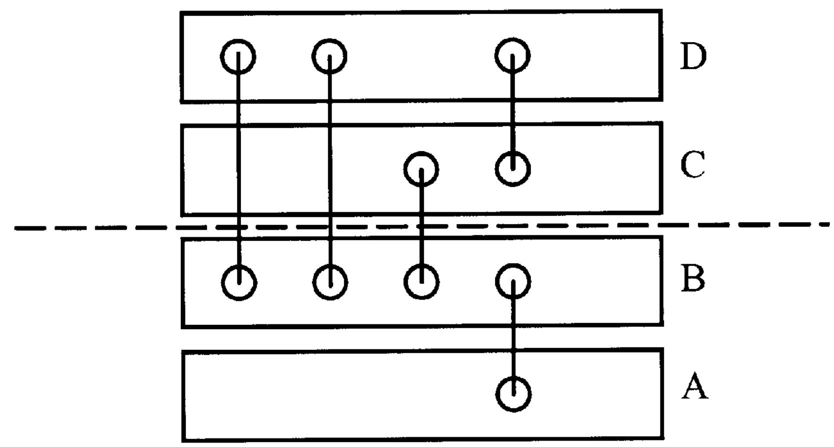
FIG. 6C illustrates the repositioning of the components after completion of the minimum cut algorithm.

FIGS. 6A–6C illustrate the performance of minimum cut algorithm. FIG. 6A illustrates an initial relative placement of components and their connectivities. As illustrated in FIG. 6B, the minimum cut algorithm manipulates the positioning of each of the components placed, while not violating the bus track or the control lines placements associated with the particular component as indicated by the data provided in the netlist. FIG. 6C depicts the repositioning of the components after completion of the minimum cut algorithm in accordance with step 430 of the process flow shown in FIG. 4.

The result of performing the minimum cut algorithm upon the initial placement of the components of FIG. 5D is illustrated in FIG. 5E. As shown in FIG. 5E, the SQR and TMN groupings were unaffected by the minimum cut algorithm and their initial relative placement was not modified. With respect to the AD, GJL, HW, PE groupings the minimum cut algorithm reassigned the groupings and modified the relational order or the relational position or both in the bus/control line positioning template.

As illustrated in FIGS. 5A–5E and 6A–6C, the process of placing components from the structural similarity group may be performed where all components are positioned at once and then subjected to a process where the number of line cuts and wire lengths are minimized.

Referring once again to FIG. 4, step 440 relates to the placement of those components from the netlist which do not appear in the structural similarity group and hence are not positioned during steps 410–430. In this step, those components not appearing in the structural similarity group are added to the placement according to their connectivities to the components that have already been placed. The placement of these components may be performed by a variety of different methodologies designed to minimize the number of line cuts and wire lengths generated by a particular placement.

The initial placement method described in regard to steps 410–440 of FIG. 4 enables all or a portion of an integrated circuit to be designed which has substantially the same timing on different bus lines and provides for relatively zero displacement, i.e. "skew", between the timing of an operation on a first bus line and an operation of a second different bus line in circuits designed according to the present invention. Use of this process also enables integrated circuits to be designed where the length of the bus lines and the number of line cuts are minimized. Thus enabling the resulting integrated circuit to have improved processing speed and the elimination for the need of deconvolution.

3. Method for Modifying a Relative Placement of Components of an Integrated Circuit by Analyzing Adjacent Components for Shared Resources A method is provided for modifying a relative placement of components of an integrated circuit based on an analysis of adjacent components for shared resources. One embodiment of this method includes: taking a relative placement of components of an integrated circuit; analyzing adjacent components for resources associated with the components which can be shared; and modifying the relative placement of components such that adjacent components share identified sharable resources.

The basic premise of the above described method is that there are certain resources or commonalities between adjacent components that can be shared by the adjacent components (cells). Therefore, by identifying those shareable resources in adjacent cells, it is possible to reorient the adjacent cells relative to each other such that the common resources can be overlapped and shared. One of the more common resources to be shared is the power bus, but pin/port locations may also be shared, thus requiring less port connections. It should be noted that signal or control lines or any common structure may also be shared.

The above described method provides for enhanced integrated circuit design and can be employed independently of or in combination with one or more methods of the present invention. It is noted that this method may be incorporated into a software program and run on a processor (not shown) in order to perform the method.

The step of analyzing adjacent cells for resources associated with the cells, which can be shared, can include an analysis of the boundary conditions of each component. The component (cell) is divided into two regions for analysis purposes. The central region is identified as the central area of the component, wherein the circuit design information is symbolically associated. For instance, the first region may represent an adder, inverter, transistor, or similar device. The component is then further divided into a boundary region, which is the region along the edge of the component not including the central region. The boundary region is the area of each component that is analyzed to determine if resource sharing is available among adjacent components.

Each component has either two power buses or two signal buses or one power bus and one signal bus connected to it. If the component has one power and one signal bus the side nearest the power or signal bus is called the power or signal bus side, respectively. If the boundary conditions of the next adjacent component has the same power bus or other shareable structure then the method attempts to commonly employ that structure. For illustration purposes used herein, it will be assumed that the power bus is the common structure.

The step of modifying the relative placement of components such that adjacent components share identified sharable resources includes, but is not limited to, manipulating, i.e. rotating, inverting, and/or flipping adjacent components in order to determine whether the power bus sides of the components can be aligned to take advantage of the power bus commonality that they share. Two or more components may share multiple structures, such as a common power and signal bus.

In addition to evaluating whether power bus lines can be shared, the method includes manipulating each component in order to analyze the boundary conditions of each component and identifying structures within the component which can be shared with other adjacent components. A component can conceivably share resources with multiple adjacent components and therefore may be analyzed multiple times before a final configuration is determined, thereby optimizing the resources of as many of the components adjacent to the component under scrutiny.

The method also includes a step of fine positioning individual components to allow for the elimination of multiple port-to-bus and control-to-bus junctions by aligning the components such that one port to bus or port to control junction will service at least two components. This process is repeated on the component being analyzed to optimize the port connections among the components adjacent to the component being analyzed.

Figure 7A:
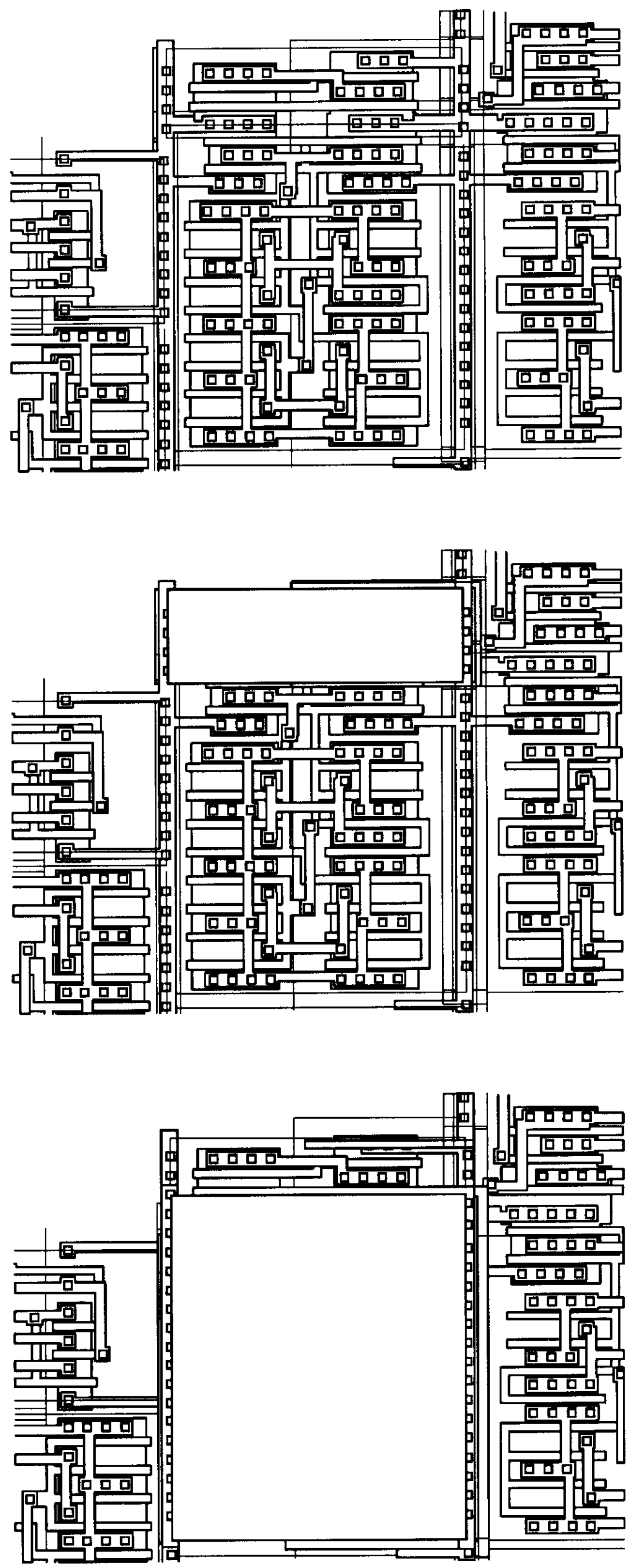
FIG. 7A illustrates the analysis of boundary conditions for a first cell.

Performance of the above described method will now be described in detail with references to FIGS. 7A–7D. In FIG. 7A, a first component 700 boundary condition is analyzed. Analysis reveals that the first component 700 contains a power bus 710 and two port to bus junctions 720 and 725 connected to power bus 710. Also according to the method, one control bus 730 and one port to control junction 735 connected to control line 730 are identified, as show in FIG. 7A. The boundary conditions are then analyzed and power bus 740 and bus to port junctions 750 and 755, control bus 760 and port to control junction 765 are identified. According to the method, it is then determined that the power bus 710 and 740 are the same and that control buses 730 and 760 are the same.

Figure 7B:
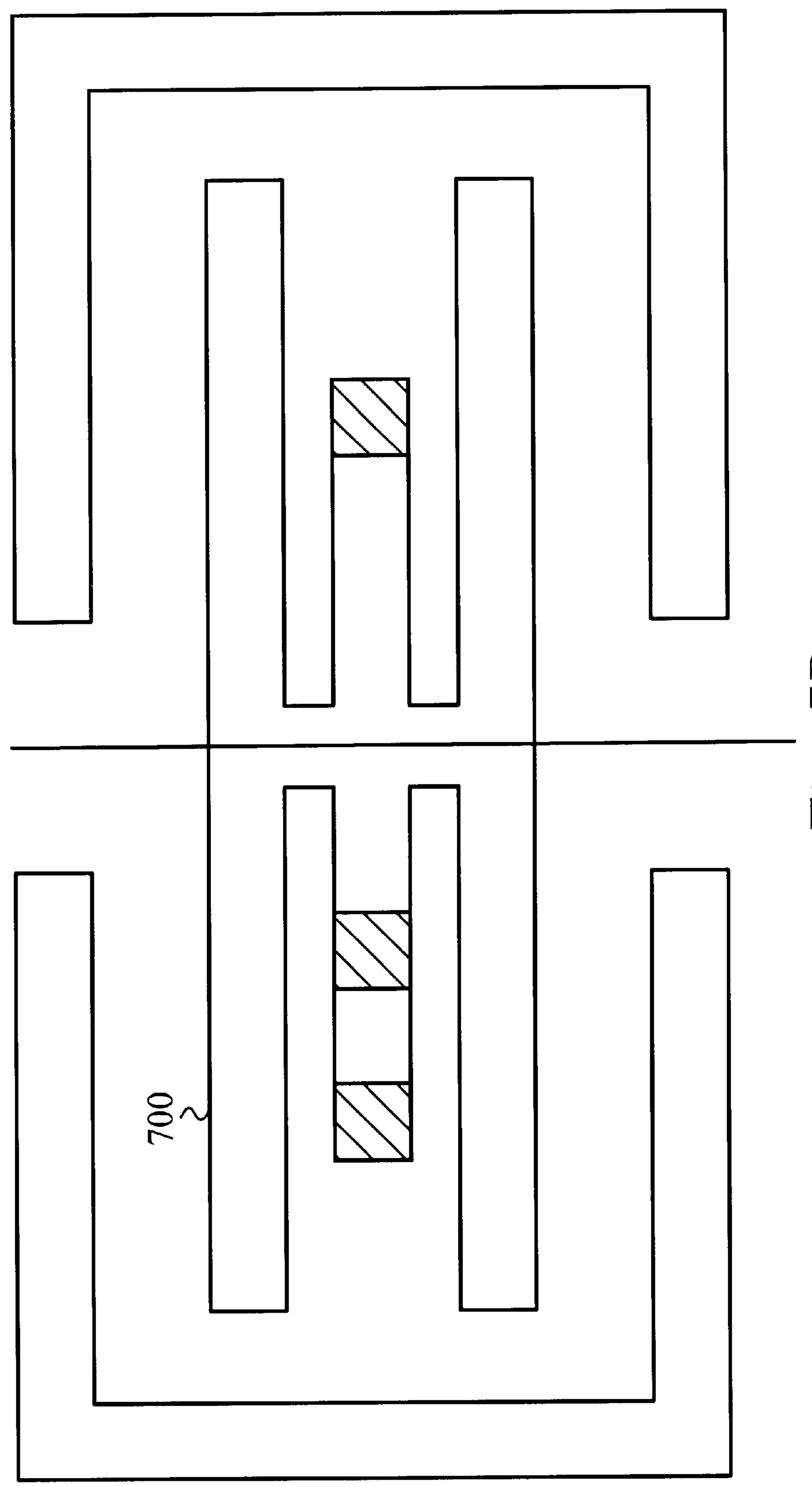
FIG. 7B illustrates the manipulation of a component.

The placement of the components is then manipulated such that the commonalities are shared as depicted in FIG. 7B. In FIG. 7B, component 700 and component 770 are overlapped such that they share common bus lines and control lines as well as port connections. In a conventional process, the power buses 710 and 740 as well as control buses 730 and 760 would have both been created in the manufacturing process, thereby utilizing twice as much chip area as necessary to provide the same functionality.

According to the method, the diffusion sharing boundary analysis is continued until each component has been analyzed and manipulated to promote sharing of any commonalities. Once each component has been analyzed, an overlapped final placement file is generated.

Figure 7C:
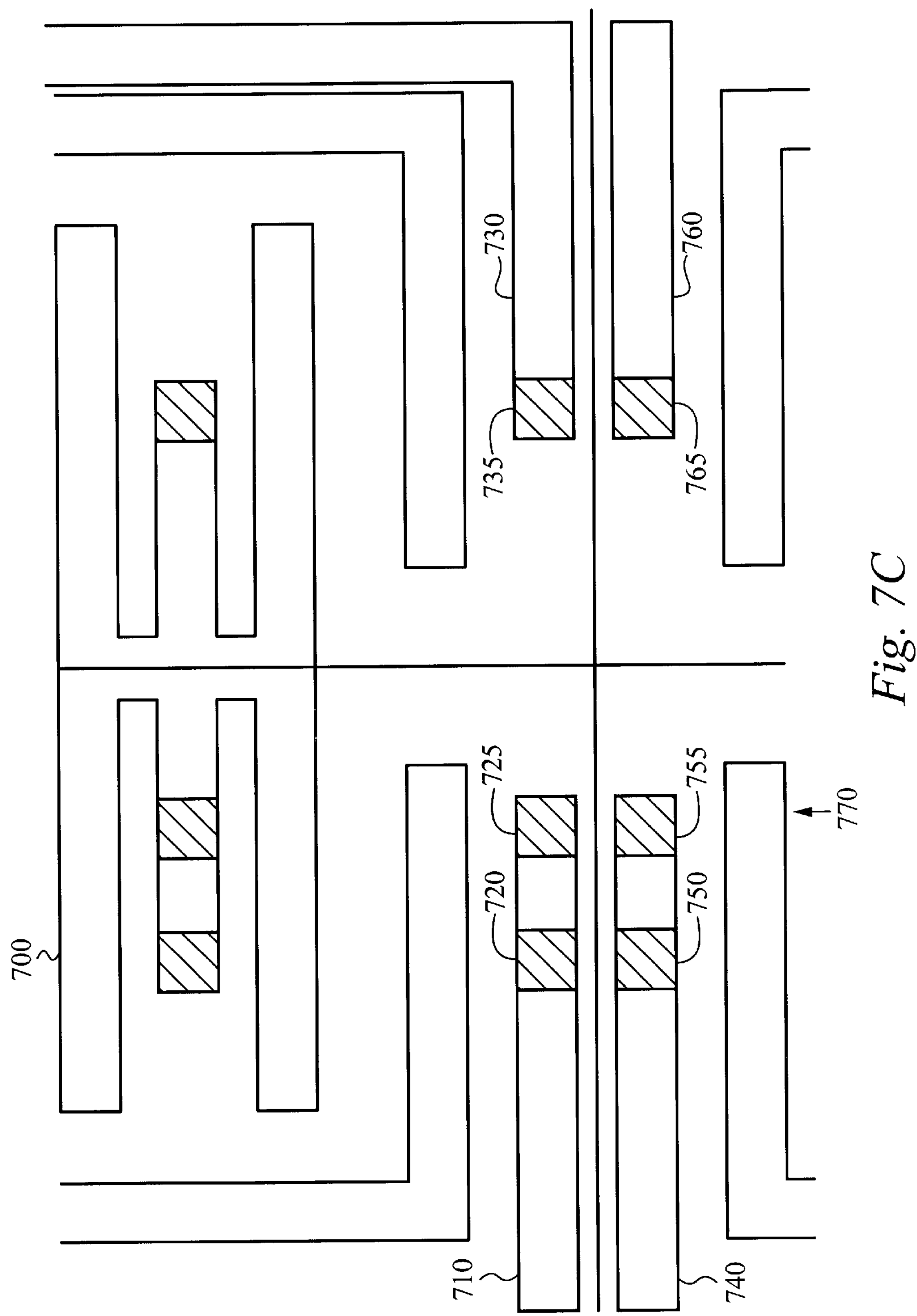
FIG. 7C illustrates a layout before the diffusion boundary method is employed on a layout.
Figure 7D:
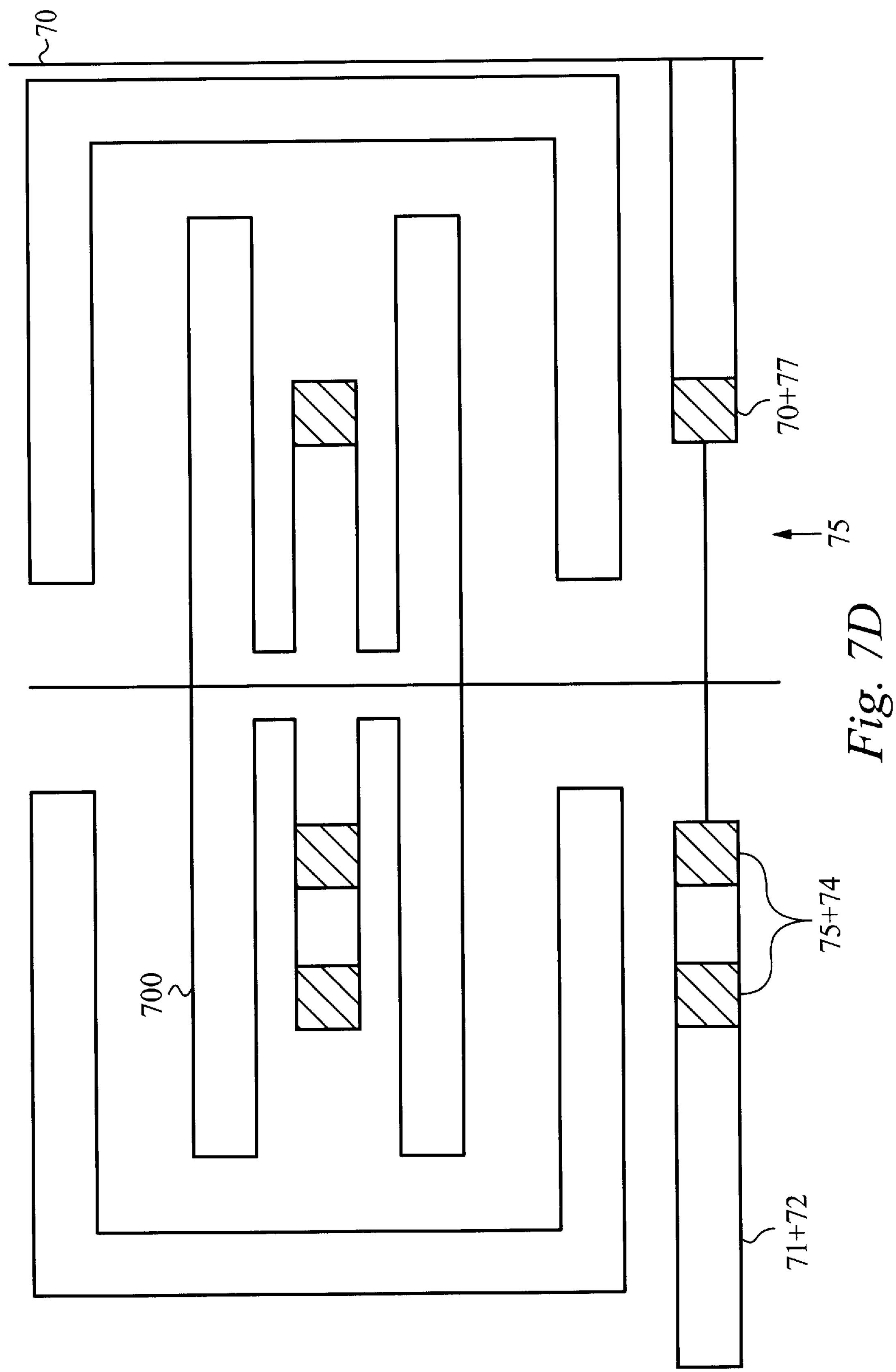
FIG. 7D illustrates a layout after the diffusion boundary method is employed on a layout.

FIGS. 7C and 7D illustrate a circuit layout before and after the diffusion boundary method is employed on the layout. The over-lapped region depicted in FIG. 7D represents the shared regions and it is readily apparent from this figure the potential chip area savings when this process is applied to hundreds of thousands of components.

By taking into consideration the identified commonalities the present invention exploits this knowledge to create higher densities in an IC design, decreased hot spots, decreased cross talk, faster through put time, lower cost and speed to market. With respect to the higher densities, the improvement can be up to 30% or higher depending on the design constraints and the type of IC that is being designed.

4. Method for Determining Bus Line Routing for Components of an Integrated Circuit Instead of routing bus lines from port to port, analogous to building individual roads from "house" to "house", the method of the present invention first determines an initial routing, analogous to first paving a major "street", then determines a cleanup routing from the initial routing to each port, analogous to paving individual "driveways" leading from the major "street" to each "house". This method simplifies the routing task. More importantly, this method is capable of generating circuit layouts which minimize skew or timing differences by minimizing the length differences between the complete bus lines of different bits.

Figure 8A:
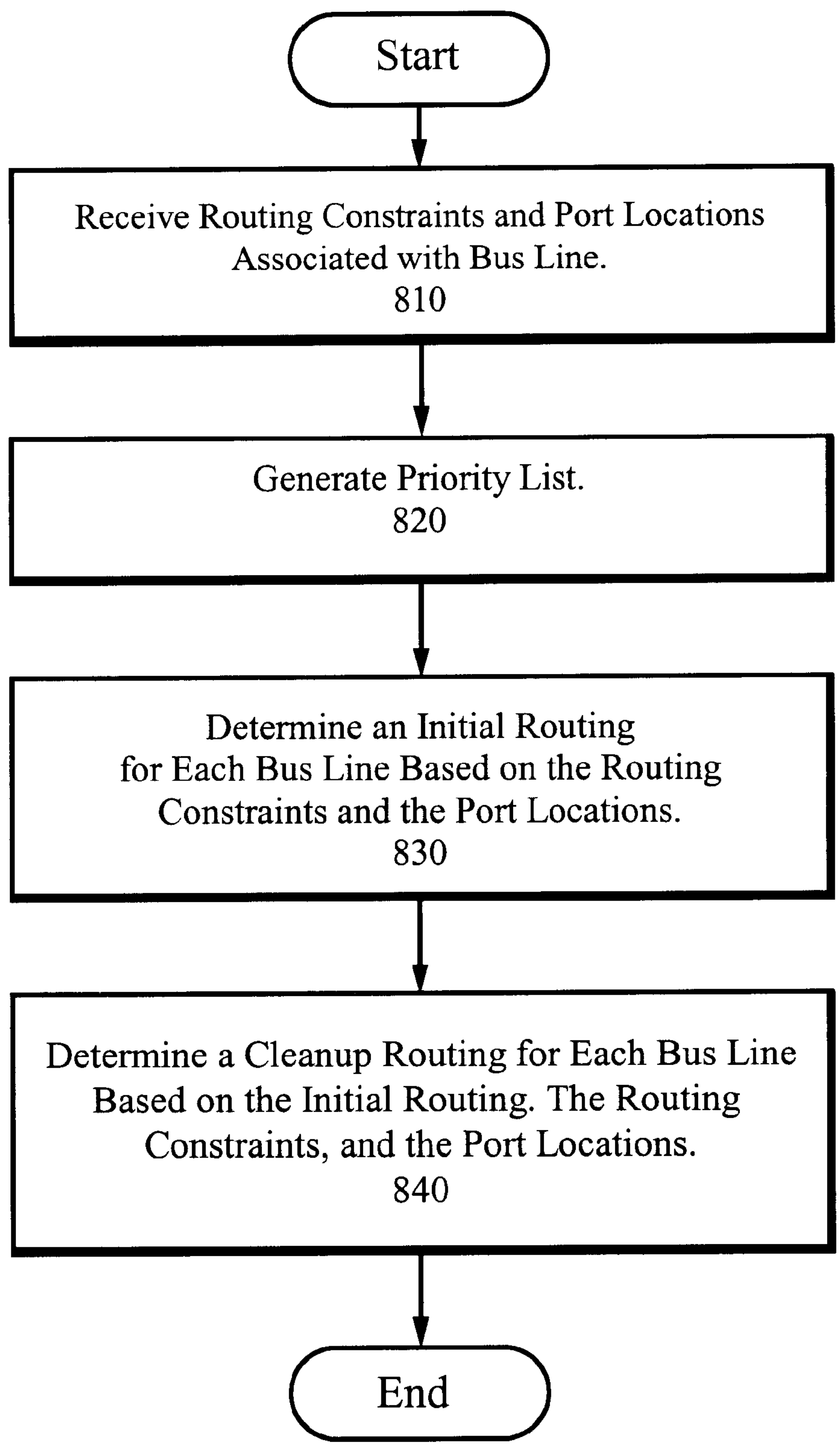
FIG. 8A shows a flow process diagram of one embodiment of a method for determining a bus line routing for components of an integrated circuit.

FIG. 8A shows a flow process diagram of one embodiment of a method for determining a bus line routing for components of an integrated circuit. The bus line routing includes an initial routing and a cleanup routing. The method includes: (1) receiving routing constraints and port locations associated with each bus line (block 810); (2) determining a routing order (block 820); (3) determining an initial routing for each bus line based on the routing constraints and the port locations, each initial routing being substantially straight (block 830); and (4) determining a cleanup routing for each bus line based on the initial routing, the routing constraints, and the port locations, the cleanup routing connecting the initial routing for each bus line to ports associated with each bus line (block 840).

1. Receiving Routing Constraints and Port Locations

Receiving routing constraints and port locations associated with each bus line (block 810) includes receiving any information necessary to perform routing of the bus lines. Routing constraints may include photolithography limitations and other information such as bus line widths, bus line spacing, and bus line shielding requirements. Port locations may include coordinates for each port and the bus line to which it must be connected. Port locations may be given with reference to two orthogonal axes, such as Cartesian coordinates. These axes may be defined as a bus line axis and an orthogonal axis, where each initial routing may be substantially parallel to the bus line axis. Routing constraints and port locations may be taken from a component placement generated using the methods described in previous sections, or a component placement generated from any auto-place and -route tool.

2. Determining a Routing Order

Figure 8B:
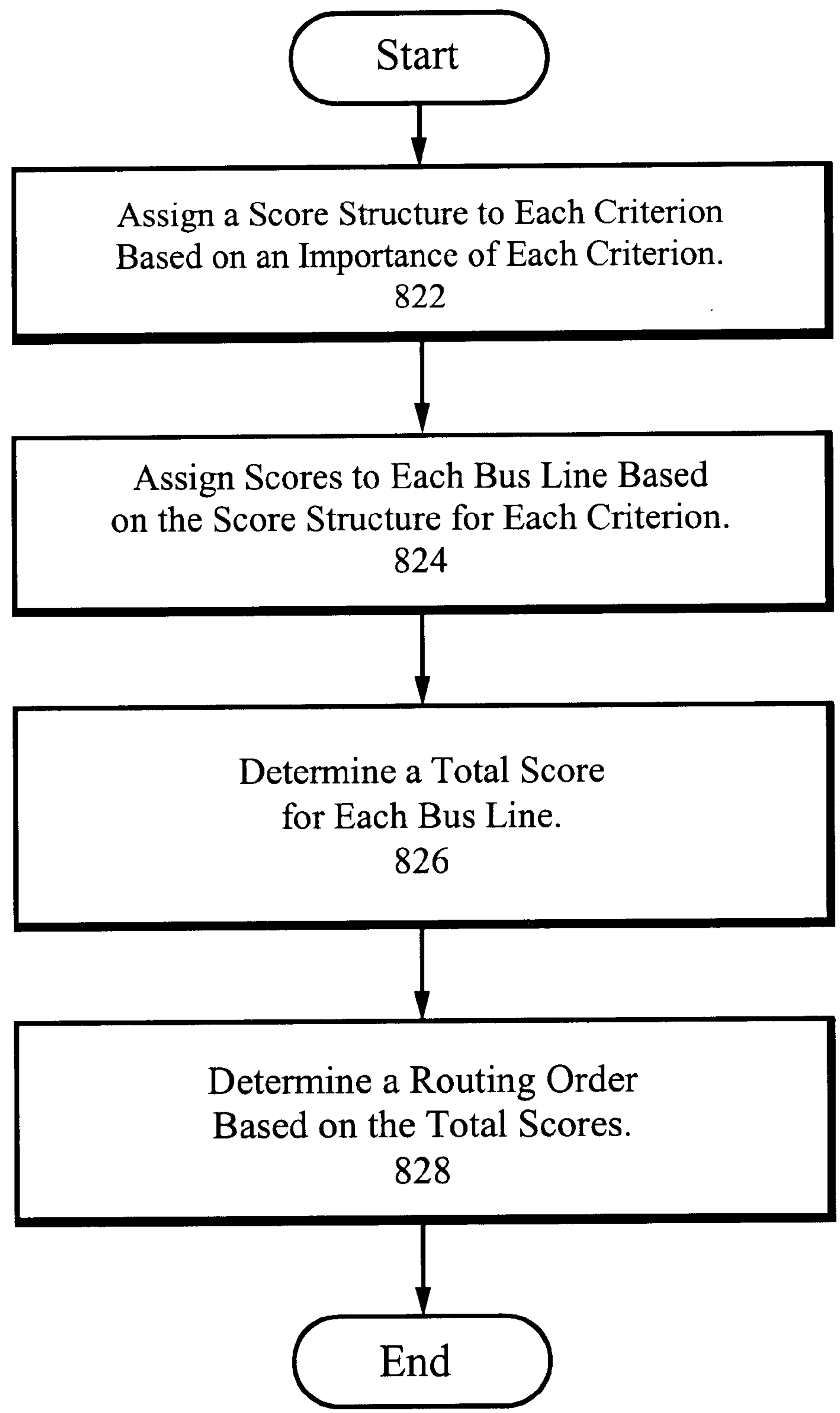
FIG. 8B shows a flow process diagram of one embodiment of a method for determining a routing order based on at least one criterion.

FIG. 8B shows a flow process diagram of one embodiment of a method for determining a routing order based on at least one criterion (block 820). This method may include: (1) assigning a score structure to each criterion based on an importance of each criterion (block 822); (2) assigning scores to each bus line based on the score structure for each criterion (block 824); (3) determining a total score for each bus line (block 826); and (4) determining a routing order based on the total scores (block 828).

The criteria may include bus line function, bus line width, and user-defined criteria. Bus line function may include whether a bus line is an input/output bus lines, which is a bus line connected to the outside world, versus an internal bus line, which is a bus line connected within a cell. Bus line width is a function of the number of ports connected to the bus lines. User-defined criteria may involve considerations of timing issues.

Assigning a score structure to each criterion based on an importance of each criterion (block 822) may be predetermined or set by the user. For example, bus line function may be given greatest importance, followed by bus line width and user-defined criteria. Within each criteria, different features are assigned different scores on the score structure. For example, input/output bus lines may be given priority over internal bus lines, and wider bus lines may be given priority over narrower bus lines.

Assigning scores to each bus line based on the score structure for each criterion (block 824) may include looking at each bus lines and determining what score each bus line should receive for each of the criteria. Determining a total score for each bus line (block 826) and determining a routing order based on the total scores (block 828) may include adding up the scores to obtain a total score for each bus line and ordering the bus lines according to the total score each bus line has received.

For example, a weighting system may be used to assign a number of priority points to each criterion, which are then added up after consideration of each criterion to give a total priority score.

EXAMPLE 1

A routing order for three bus lines A, B, and C must be determined according to two criteria, in order of importance: (1) bus line function; and (2) bus line width. Bus line function is given a score ranging from 0–3, where 0 is an internal bus line and 3 is an input/output bus line. Bus line width is given a sore ranging from 1–3, from narrowest to widest bus line. The bus line with the greatest score is routed first, and so on. Bus line A is an internal bus line and the widest bus line. Bus line B is an input/output bus line and the narrowest bus line. Bus line C is an internal bus line and the second widest bus line.

| Bus line | Bus line f(x) | Bus line width | Total score | Routing order |
|---|---|---|---|---|
| A | 0 | 3 | 3 | 2 |
| B | 3 | 1 | 4 | 1 |
| C | 0 | 2 | 2 | 3 |

Thus, bus line B will be routed first, followed by bus line A and bus line C. Note that the score structure has the effect of giving bus line function greater importance than bus line width.

3. Determining an Initial Routing

Figure 8C:
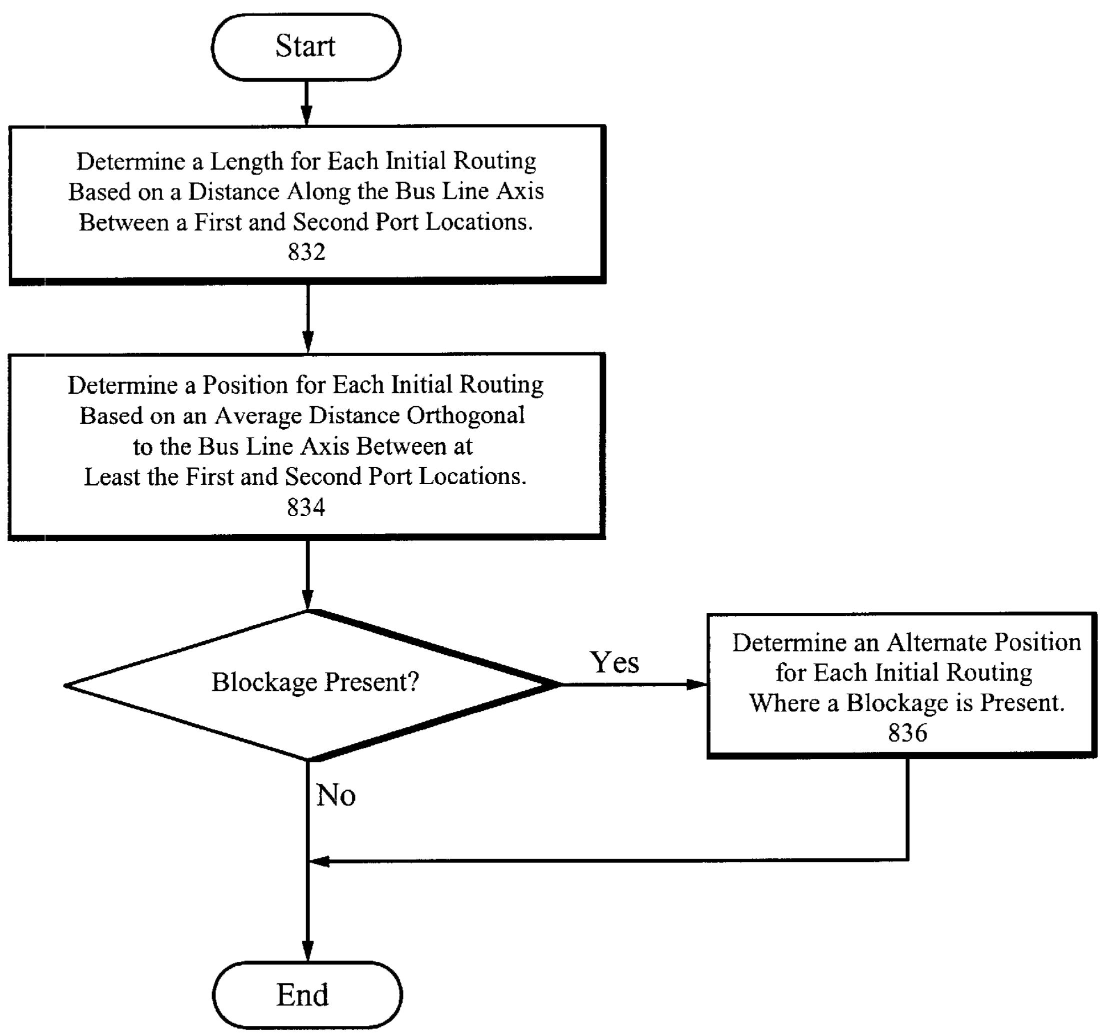
FIG. 8C shows a flow process diagram of one embodiment of a method for determining an initial routing for each bus line based on the routing constraints and the port locations.

FIG. 8C shows a flow process diagram of one embodiment of a method for determining an initial routing for each bus line based on the routing constraints and the port locations, each initial routing being substantially straight (block 830). The method may include: (1) determining a length for each initial routing based on a distance along the bus line axis between a first and second port locations (block 832); and (2) determining a position for each initial routing based on an average distance orthogonal to the bus line axis between at least the first and second port locations (block 834). The method may further comprise: (3) determining an alternate position for each initial routing where a blockage is present (block 836).

Each of the port locations may be associated with a first coordinate along the bus line axis and a second coordinate orthogonal to the bus line axis. Determining a length for each initial routing (block 832) may include calculating a difference of the first coordinates associated with the first and second port locations. Determining a position for each initial routing (block 834) may include calculating an average of the second coordinates associated with at least the first and second port locations.

If Cartesian coordinates are used, determining a length for each initial routing (block 832) may include calculating a difference of the x coordinates associated with the first and second bus line port locations. Determining a position for each initial routing (block 834) may include calculating an average of the y coordinates associated with the first and second port locations and possibly other port locations.

Blockages may arise where the space or track needed for the initial routing has already been used, such as for a previous routing. Determining an alternate position for each initial routing where a blockage is present (block 836) may include defining a search region based on at least the first and second port locations, and then selecting a closest available position located within the search region. The search region may be a rectangular routing window which has at least two comers defined by the first and second port locations. For example, the routing window may have diagonally opposing corners defined by the first and second port locations. The alternate position may be selected by first looking to tracks immediately adjacent to the average position.

4. Determining a Cleanup Routing

Figure 8D:
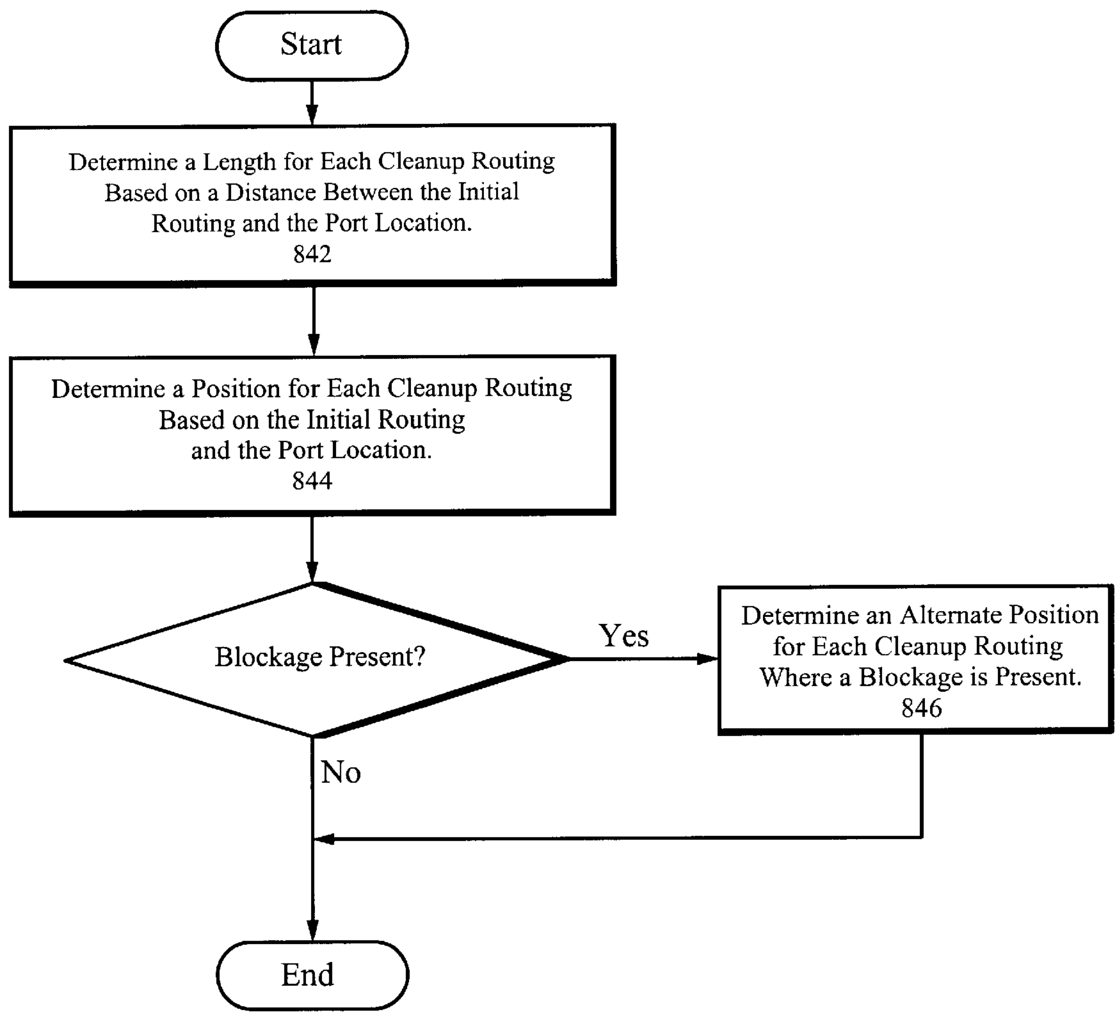
FIG. 8D shows a flow process diagram of one embodiment of a method for determining a cleanup routing for each port location based on the initial routing, the routing constraints, and the port locations.

FIG. 8D shows a flow process diagram of one embodiment of a method for determining a cleanup routing for each port location based on the initial routing, the routing constraints, and the port locations, the cleanup routing connecting the initial routing for each bus line to ports associated with each bus line (block 840). The method may include: (1) determining a length for each cleanup routing based on a distance between the initial routing and the port location (block 842); and (2) determining a position for each cleanup routing based on the initial routing and the port location (block 844). The method may further comprise: (3) determining an alternate position for each cleanup routing where a blockage is present (block 846). An external router normally used as part of an auto-place and -route tool may be used to perform cleanup routing.

Determining a length for each cleanup routing based on a distance between the initial routing and the port location (block 842) may include finding the shortest distance between the initial routing and each port. Determining a position for each cleanup routing based on the initial routing and the port location (block 844) may include positioning the cleanup routing to connect the initial routing and each port.

Blockages may arise where the space or track has already been used, such as for a previous routing. Determining an alternate routing for each cleanup routing where a blockage is present (block 846) may include generating a cleanup routing around the blockage. The alternate routing may be selected by first looking to tracks immediately adjacent to the shortest routing, and then determining the shortest Manhattan length from the initial routing to each port.

EXAMPLE 2

Figure 8E:
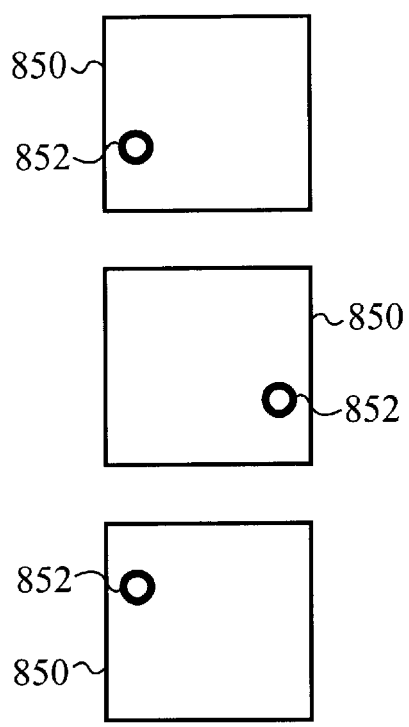
FIGS. 8E–8L show one example of a method for determining a bus line routing for components of an integrated circuit.

FIGS. 8E–8L show one example of a method for determining a bus line routing for components of an integrated circuit. FIG. 8E shows a placement of components 850 of an integrated circuit. The placement includes information about the individual placement of each component 850. Components 850 may be of different sizes, abut or overlap each other, and/or be spaced at varying distances from each other. Components 850 may each have one or more ports 852 to be connected to the bus line. The routing constraints and port locations may be part of the placement information, or separate.

A routing order for the bus lines is determined according to bus line function and bus line width. Bus line routing is determined in the routing order.

Figure 8F:
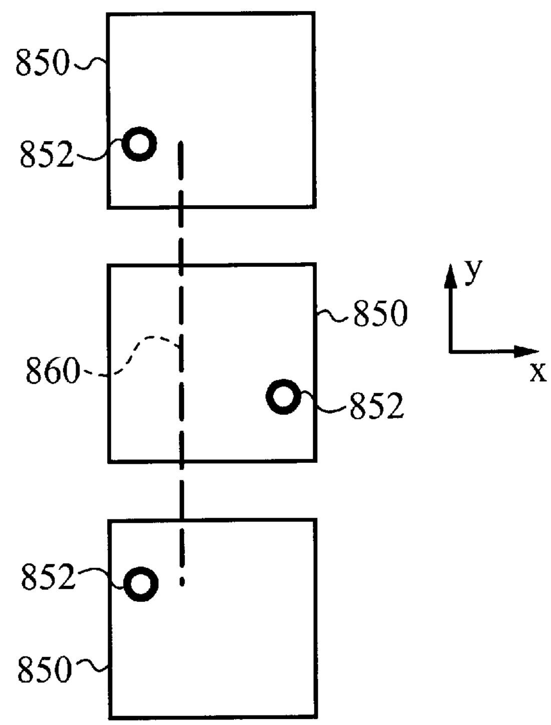

FIG. 8F shows an initial routing 860 for the bus line. Initial routing 860 is substantially straight, and parallel to a bus line axis, which is coincident to the y-axis as shown in the figures. The length of initial routing 860 is determined along the bus line axis, based on the locations of the two furthest ports 852 for this particular section of the bus line. The position of initial routing 860 is determined along an axis orthogonal to bus axis, which is coincident to the x-axis as shown in the figures. The position of initial routing 860 is determined by calculating an average of the x-values of the locations of ports 852. This approach minimizes the length of the cleanup routing.

Figure 8G:
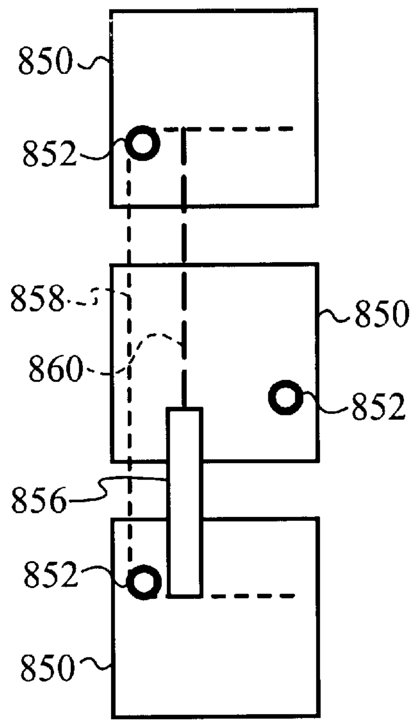
Figure 8H:
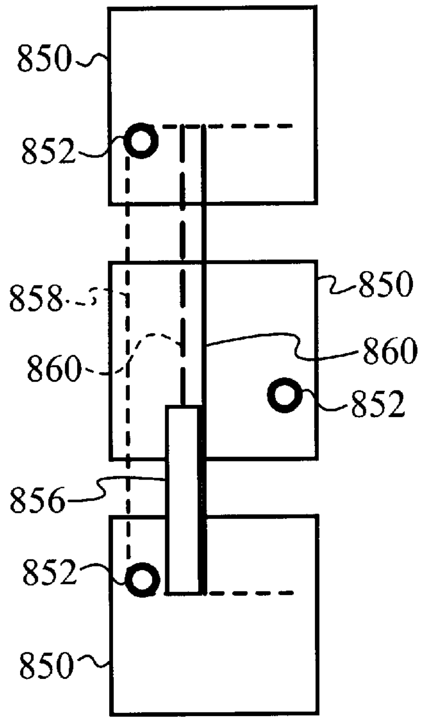

FIG. 8G shows a blockage 856 present and interfering with initial routing 860. A search region 858 is then created, in this case a rectangular region which uses ports 852 to define its comers. FIG. 8H shows an alternate position for initial routing 860 selected to avoid interference with blockage 856. Initial routing 860 is moved by looking to the tracks immediately adjacent to blockage 856. For example, the tracks immediately to the top and the bottom of blockage 856 may be searched and their availability determined. Initial routing 860 may be moved to still minimize the lengths of the cleanup routing in view of blockage 856.

Figure 8I:
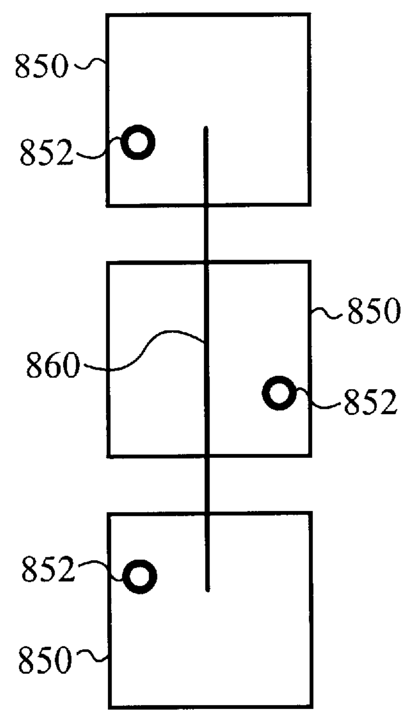
Figure 8J:
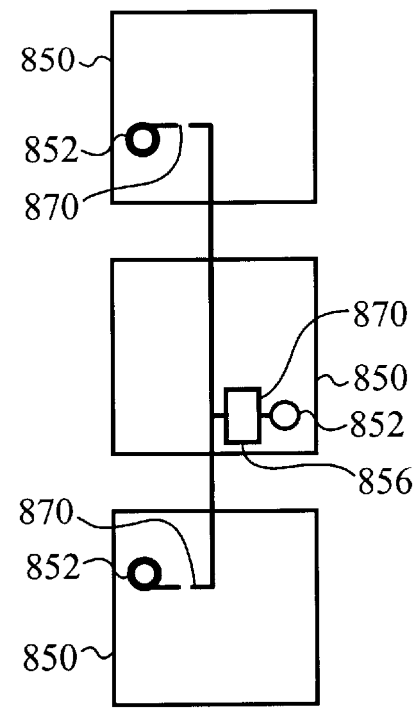
Figure 8K:
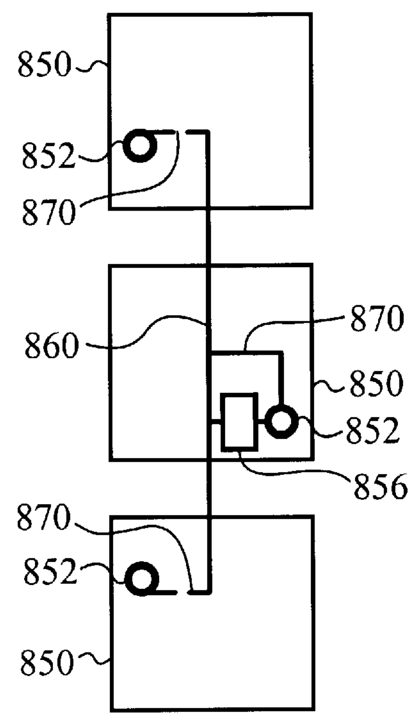
Figure 8L:
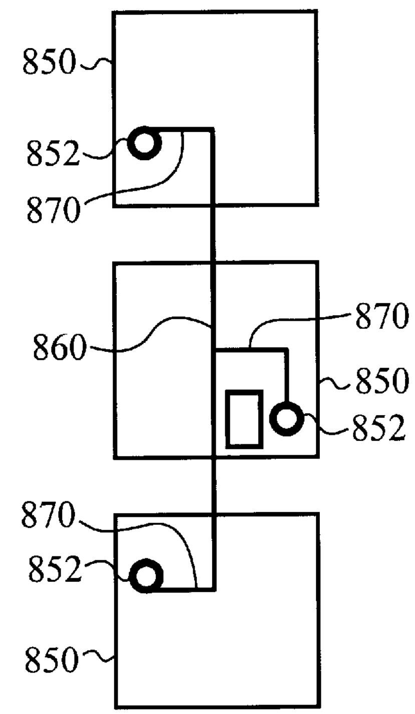

FIG. 8I shows initial routing 860 complete and ready for cleanup routing. FIG. 8J shows cleanup routing 870 which connects initial routing 860 to each of ports 852. In general, cleanup routing 870 is selected to be the shortest distance from initial routing 860 to each of ports 852. A blockage 856 interferes with one section of cleanup routing 870. FIG. 8K shows an alternate routing for this section of cleanup routing 870 to circumvent blockage 856. FIG. 8L shows both initial routing 860 and cleanup routing 870 complete.

5. Method for Determining Control Line Routing for Components of an Integrated Circuit Instead of routing control lines from port to port, analogous to building individual roads from "house" to "house", the method of the present invention first determines an initial routing, analogous to first paving a major "street", then determines a cleanup routing from the initial routing to each port, analogous to paving individual "driveways" leading from the major "street" to each "house". This method simplifies the routing task. More importantly, this method is capable of generating circuit layouts which minimize skew and timing differences by minimizing the lengths of the control lines.

Figure 9A:
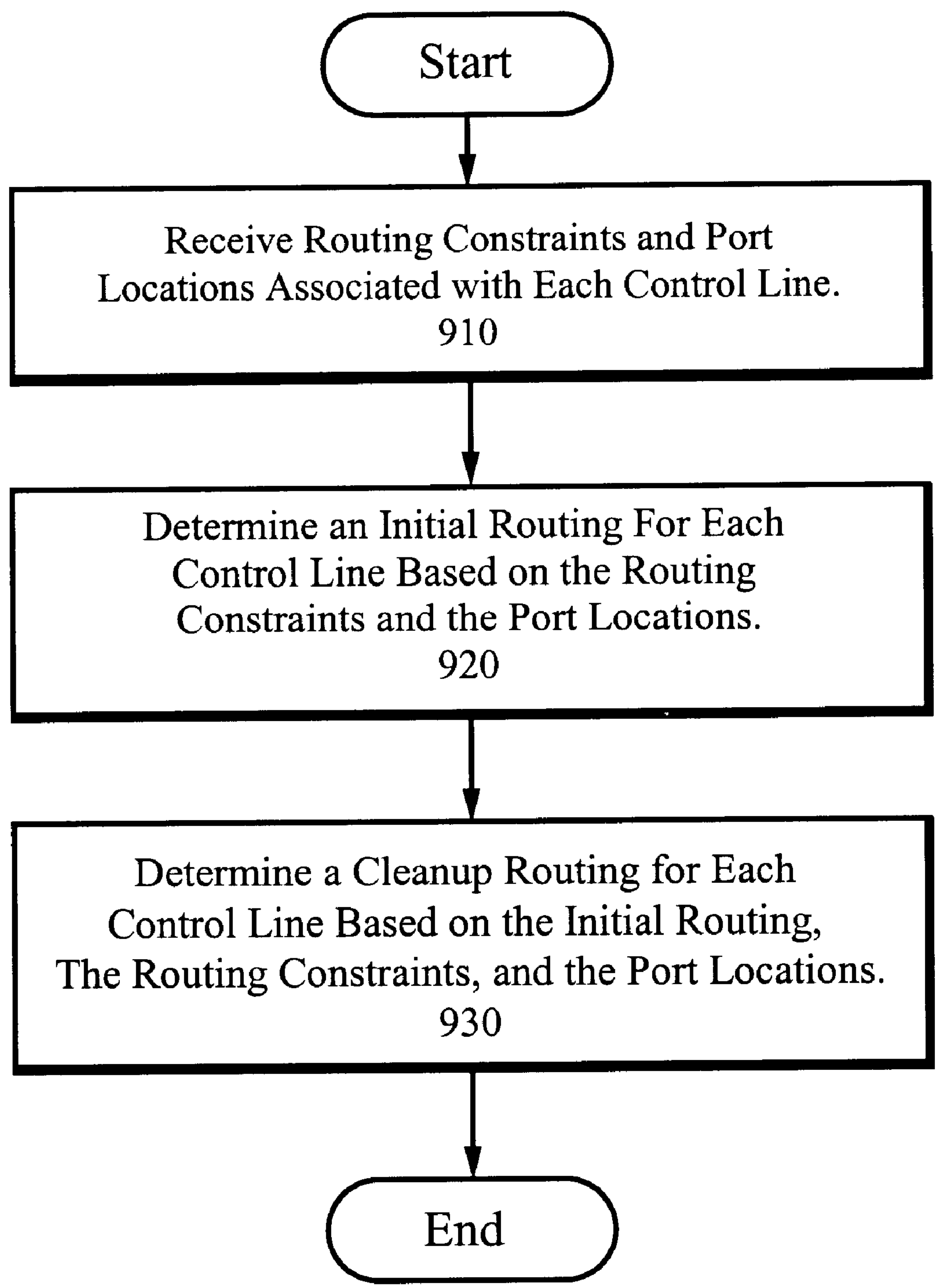
FIG. 9A shows a flow process diagram of one embodiment of a method for determining a control line routing for components of an integrated circuit.

FIG. 9A shows a flow process diagram of one embodiment of a method for determining a control line routing for components of an integrated circuit. The control line routing includes an initial routing and a cleanup routing. The method includes: (1) receiving routing constraints and port locations associated with each control line (block 910); (2) determining an initial routing for each control line based on the routing constraints and the port locations, each initial routing being substantially straight (block 920); and (3) determining a cleanup routing for each control line based on the initial routing, the routing constraints, and the port locations, the cleanup routing connecting the initial routing for each control line to ports associated with each control line (block 930).

1. Receiving Routing Constraints and Port Locations

Receiving routing constraints and port locations associated with each control line (block 910) includes receiving any information necessary to perform routing of the control lines. Routing constraints may include photolithography limitations and other information such as control line widths, control line spacing, and control line shielding requirements. Port locations may include coordinates for each port and the control line to which it must be connected. Port locations may be given with reference to two orthogonal axes, such as Cartesian coordinates. These axes may be defined as a control line axis and an orthogonal axis, where each initial routing may be substantially parallel to the control line axis. Routing constraints and port locations may be taken from a component placement generated using the methods described in previous sections, or a component placement generated from any auto-place and -route tool.

2. Determining an Initial Routing

Figure 9B:
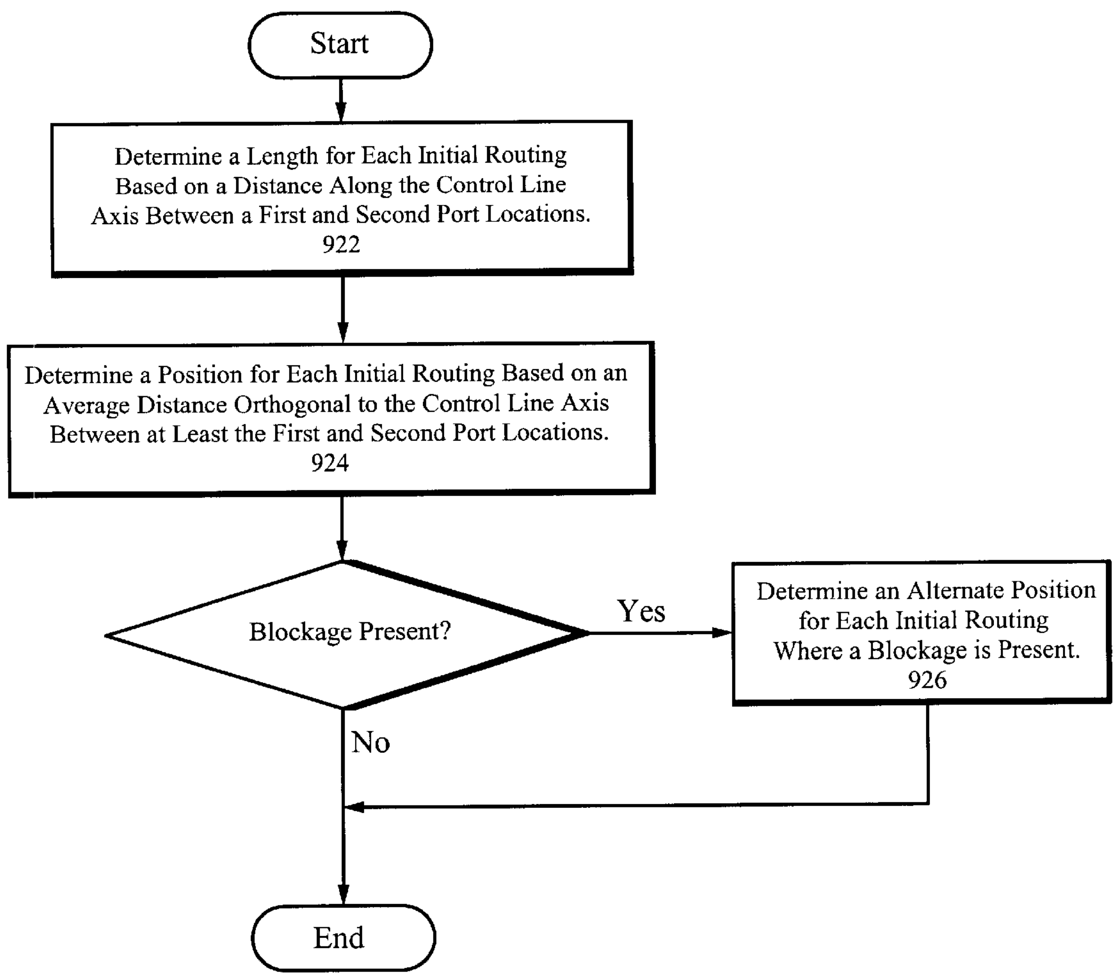
FIG. 9B shows a flow process diagram of one embodiment of a method for determining an initial routing for each control line based on the routing constraints and the port locations.

FIG. 9B shows a flow process diagram of one embodiment of a method for determining an initial routing for each control line based on the routing constraints and the port locations, each initial routing being substantially straight (block 920). The method may include: (1) determining a length for each initial routing based on a distance along the control line axis between a first and second port locations (block 922); and (2) determining a position for each initial routing based on an average distance orthogonal to the control line axis between at least the first and second port locations (block 924). The method may further comprise: (3) determining an alternate position for each initial routing where a blockage is present (block 926).

Each of the port locations may be associated with a first coordinate along the control line axis and a second coordinate orthogonal to the control line axis. Determining a length for each initial routing (block 922) may include calculating a difference of the first coordinates associated with the first and second port locations. Determining a position for each initial routing (block 924) may include calculating an average of the second coordinates associated with at least the first and second port locations.

If Cartesian coordinates are used, determining a length for each initial routing (block 922) may include calculating a difference of the x coordinates associated with the first and second control line port locations. Determining a position for each initial routing (block 924) may include calculating an average of the y coordinates associated with the first and second port locations and possibly other port locations.

Blockages may arise where the space or track needed for the initial routing has already been used, such as for a previous routing. Determining an alternate position for each initial routing where a blockage is present (block 926) may include defining a search region based on at least the first and second port locations, and then selecting a closest available position located within the search region. The search region may be a rectangular routing window which has at least two corners defined by the first and second port locations. For example, the routing window may have diagonally opposing corners defined by the first and second port locations. The alternate position may be selected by first looking to tracks immediately adjacent to the average position.

3. Determining a Cleanup Routing

Figure 9C:
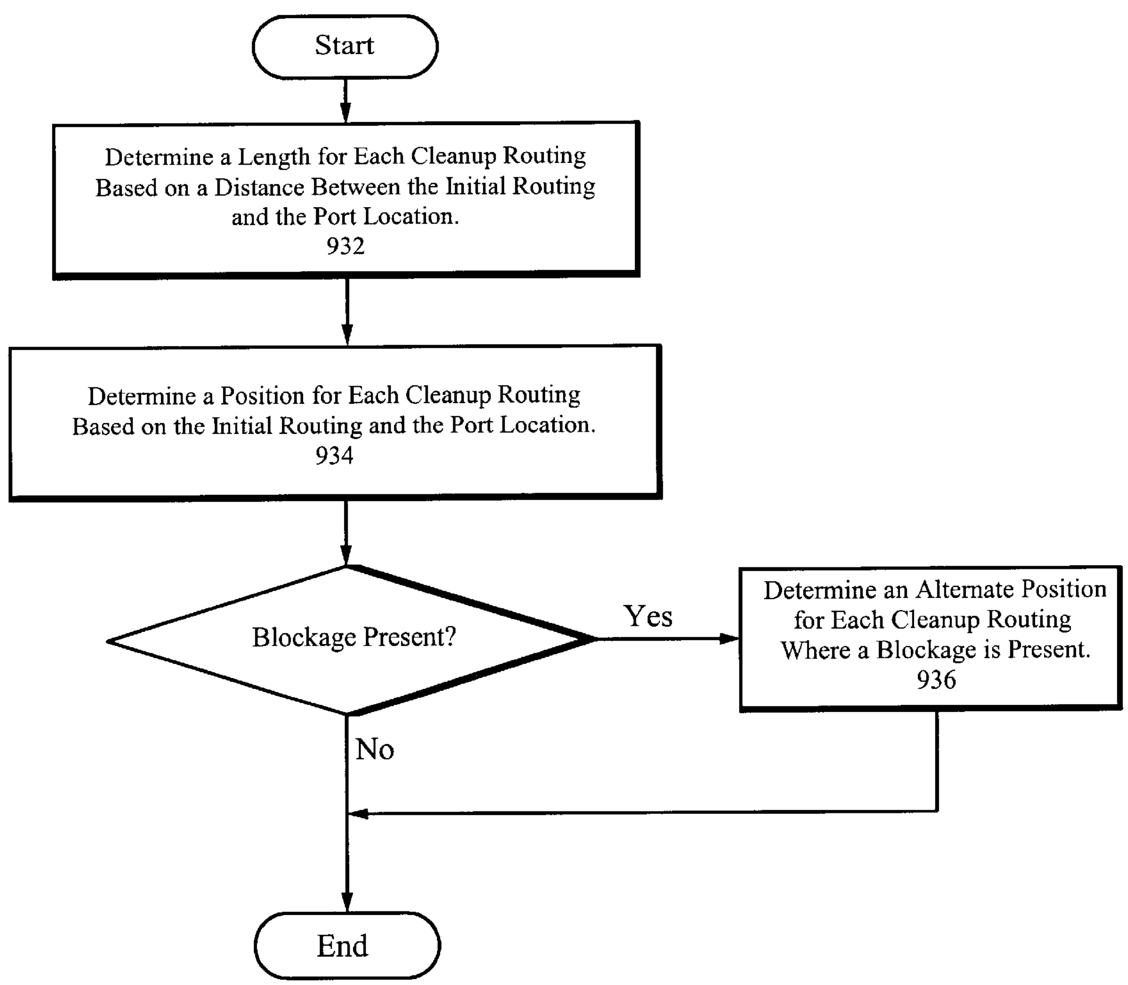
FIG. 9C shows a flow process diagram of one embodiment of a method for determining a cleanup routing for each port location based on the initial routing, the routing constraints, and the port locations.

FIG. 9C shows a flow process diagram of one embodiment of a method for determining a cleanup routing for each port location based on the initial routing, the routing constraints, and the port locations, the cleanup routing connecting the initial routing for each control line to ports associated with each control line (block 930). The method may include: (1) determining a length for each cleanup routing based on a distance between the initial routing and the port location (block 932); and (2) determining a position for each cleanup routing based on the initial routing and the port location (block 934). The method may further comprise: (3) determining an alternate position for each cleanup routing where a blockage is present (block 936). An external router normally used as part of an auto-place and -route tool may be used to perform cleanup routing.

Determining a length for each cleanup routing based on a distance between the lo initial routing and the port location (block 932) may include finding the shortest distance between the initial routing and each port. Determining a position for each cleanup routing based on the initial routing and the port location (block 934) may include positioning the cleanup routing to connect the initial routing and each port.

Blockages may arise where the space or track has already been used, such as for a previous routing. Determining an alternate routing for each cleanup routing where a blockage is present (block 936) may include generating a cleanup routing around the blockage. The alternate routing may be selected by first looking to tracks immediately adjacent to the shortest routing, and then determining the shortest Manhattan length from the initial routing to each port.

EXAMPLE 3

Figure 9D:
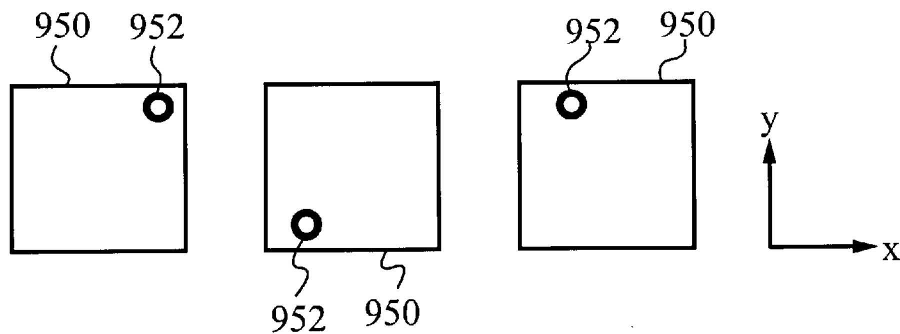
FIGS. 9D–9K show one example of a method for determining a control line routing for components of an integrated circuit.

FIGS. 9D–9K show one example of a method for determining a control line routing for components of an integrated circuit. FIG. 9D shows a placement of components 950 of an integrated circuit. The placement includes information about the individual placement of each component 950. Components 950 may be of different sizes, abut or overlap each other, and/or be spaced at varying distances from each other. Components 950 may each have one or more ports 952 to be connected to the control line. The routing constraints and port locations may be part of the placement information, or separate.

Figure 9E:
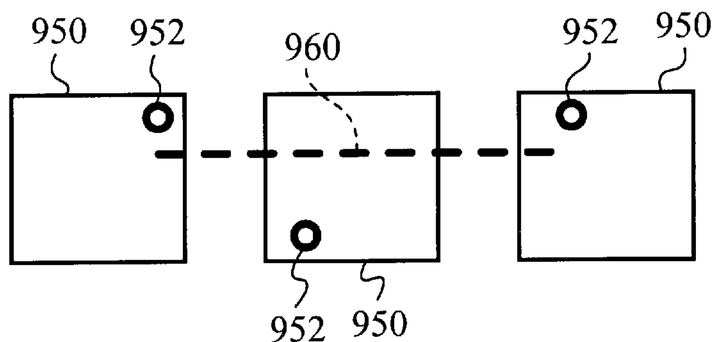

FIG. 9E shows an initial routing 960 for the control line. Initial routing 960 is substantially straight, and parallel to a control line axis, which is coincident to the x-axis as shown in the figures. The length of initial routing 960 is determined along the control line axis, based on the locations of the two furthest ports 952 for this particular section of the control line. The position of initial routing 960 is. determined along an axis orthogonal to control axis, which is coincident to the y-axis as shown in the figures. The position of initial routing 960 is determined by calculating an average of the y-values of the locations of ports 952. This approach minimizes the length of the cleanup routing.

Figure 9F:
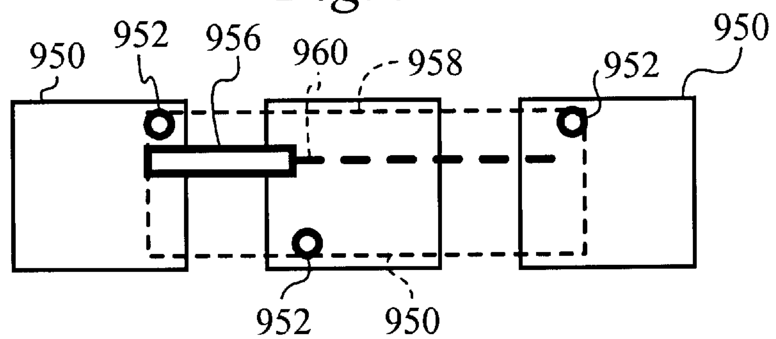
Figure 9G:
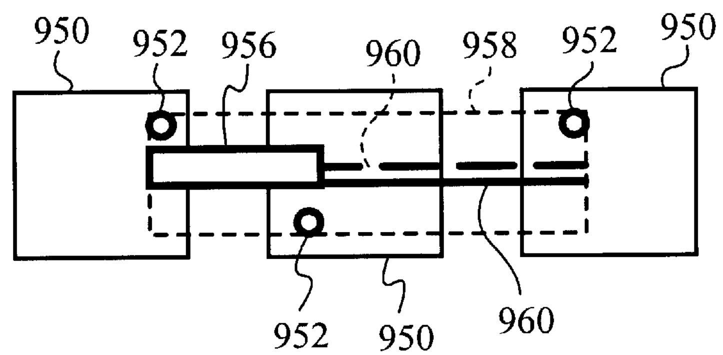

FIG. 9F shows a blockage 956 present and interfering with initial routing 960. A search region 958 is then created, in this case a rectangular region which uses ports 952 to define its comers. FIG. 9G shows an alternate position for initial routing 960 selected to avoid interference with blockage 956. Initial routing 960 is moved by looking to the tracks immediately adjacent to blockage 956. For example, the tracks immediately to the top and the bottom of blockage 956 may be searched and their availability determined. Initial routing 960 may be moved to still minimize the lengths of the cleanup routing in view of blockage 956.

Figure 9H:
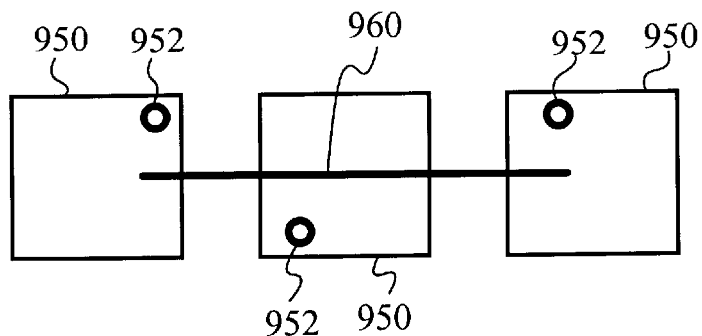
Figure 9I:
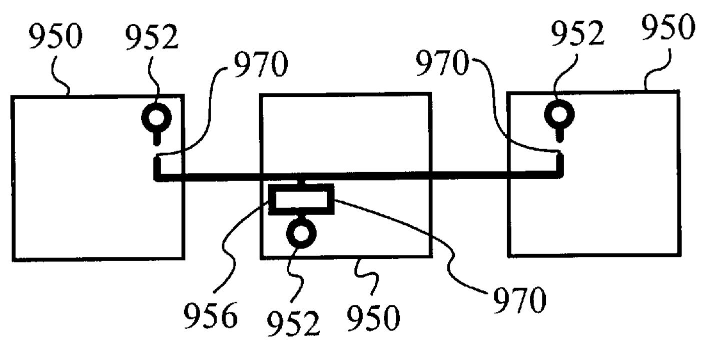
Figure 9J:
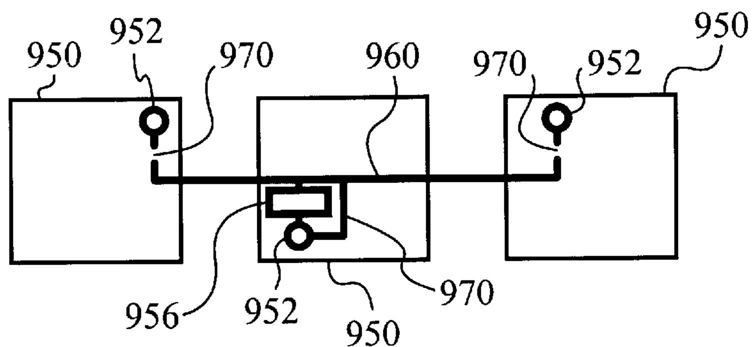
Figure 9K:
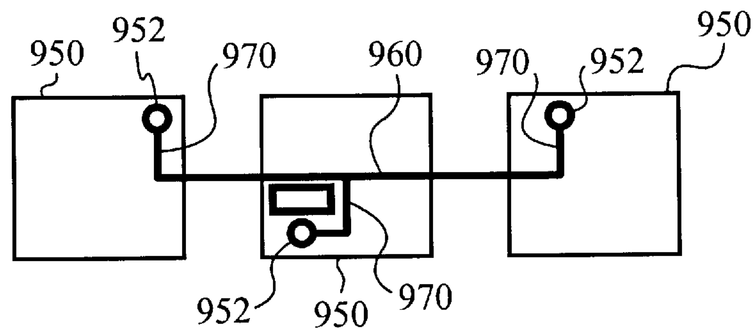

FIG. 9H shows initial routing 960 complete and ready for cleanup routing. FIG. 91 shows cleanup routing 970 which connects initial routing 960 to each of ports 952. In general, cleanup routing 970 is selected to be the shortest distance from initial routing 960 to each of ports 952. A blockage 956 interferes with one section of cleanup routing 970. FIG. 9J shows an alternate routing for this section of cleanup routing 970 to circumvent blockage 956. FIG. 9K shows both initial routing 960 and cleanup routing 970 complete.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A computer implemented method for forming a relative placement of components of an integrated circuit from a netlist comprising:

taking a netlist representation of components forming all or part of an integrated circuit;

forming groups of components within the netlist which have at least a selected degree of structural similarity between each other;

making a structural similarity group which includes those groups of components identified as having at least the selected degree of structural similarity;

performing an initial relative placement of the groups of components;

reducing wire lengths between components of initial relative placement; and adding to the relative placement those components from the netlist which were not included in the groups of components.

2. A method according to claim 1 wherein the step of forming groups of components having at least a selected degree of structural similarity between each other includes forming groups of components which include at least two components.

3. A method according to claim 1 wherein the step of forming groups of components having at least a selected degree of structural similarity between each other includes forming groups of components which include at least three components.

4. A method according to claim 1 wherein the step of forming groups of components having at least a selected degree of structural similarity between each other includes forming groups of components which include at least four components.

5. A method according to claim 1 wherein the step of forming groups of components having at least a selected degree of structural similarity between each other includes forming groups of components having at least 10% similarity in bus line and control line connectivity between components of the group.

6. A method according to claim 1 wherein the step of forming groups of components having at least a selected degree of structural similarity between each other includes forming groups of components having at least 20% similarity in bus line and control line connectivity between components of the group.

7. A method according to claim 1 wherein the step of forming groups of components having at least a selected degree of structural similarity between each other includes forming groups of components having at least 33% similarity in bus line and control line connectivity between components of the group.

8. A method according to claim 1 wherein the step of forming groups of components having at least a selected degree of structural similarity between each other includes forming groups of components having at least 50% similarity in bus line and control line connectivity between components of the group.

9. A method according to claim 1 wherein the step of forming groups of components having at least a selected degree of structural similarity between each other includes forming groups of components having at least 66% similarity in bus line and control line connectivity between components of the group.

10. A method according to claim 1 wherein the step of forming groups of components having at least a selected degree of structural similarity between each other includes forming groups of components having at least 75% similarity in bus line and control line connectivity between components of the group.

11. A method according to claim 1 wherein the step of forming groups of components having at least a selected degree of structural similarity between each other includes forming groups of components having at least 80% similarity in bus line and control line connectivity between components of the group.

12. A method according to claim 1 wherein the netlist indicates an order for bus lines in the circuit, the step of performing an initial relative placement of the groups of components includes conserving the order of bus lines indicated in the netlist.

13. A method according to claim 12 further comprising modifying the relative placement of components including conserving the order of bus lines indicated in the netlist.

14. An integrated circuit design tool comprising:

a processor; and memory coupled to the processor including instructions which when executed by the processor takes a netlist representation of components forming all or part of an integrated circuit and performs the following steps forming groups of components within the netlist which have at least a selected degree of structural similarity between each other, making a structural similarity group which includes those groups of components identified as having at least the selected degree of structural similarity, performing an initial relative placement of the groups of components, reducing wire lengths between components of initial relative placement, and adding to the relative placement those components from the netlist which were not included in the groups of components.

15. A design tool according to claim 14 wherein the step of forming groups of components having at least a selected degree of structural similarity between each other includes forming groups of components which include at least two components.

16. A design tool according to claim 14 wherein the step of forming groups of components having at least a selected degree of structural similarity between each other includes forming groups of components which include at least three components.

17. A design tool according to claim 14 wherein the step of forming groups of components having at least a selected degree of structural similarity between each other includes forming groups of components which include at least four components.

18. A design tool according to claim 14 wherein the step of forming groups of components having at least a selected degree of structural similarity between each other includes forming groups of components having at least 10% similarity in bus line and control line connectivity between components of the group.

19. A design tool according to claim 14 wherein the step of forming groups of components having at least a selected degree of structural similarity between each other includes forming groups of components having at least 20% similarity in bus line and control line connectivity between components of the group.

20. A design tool according to claim 14 wherein the step of forming groups of components having at least a selected degree of structural similarity between each other includes forming groups of components having at least 33% similarity in bus line and control line connectivity between components of the group.

21. A design tool according to claim 14 wherein the step of forming groups of components having at least a selected degree of structural similarity between each other includes forming groups of components having at least 50% similarity in bus line and control line connectivity between components of the group.

22. A design tool according to claim 14 wherein the step of forming groups of components having at least a selected degree of structural similarity between each other includes forming groups of components having at least 66% similarity in bus line and control line connectivity between components of the group.

23. A design tool according to claim 14 wherein the step of forming groups of components having at least a selected degree of structural similarity between each other includes forming groups of components having at least 75% similarity in bus line and control line connectivity between components of the group.

24. A design tool according to claim 14 wherein the step of forming groups of components having at least a selected degree of structural similarity between each other includes forming groups of components having at least 80% similarity in bus line and control line connectivity between components of the group.

25. A design tool according to claim 14 wherein the netlist indicates an order for bus lines in the circuit, the step of performing an initial relative placement of the groups of components includes conserving the order of bus lines indicated in the netlist.

26. A design tool according to claim 25 further comprising modifying the relative placement of components including conserving the order of bus lines indicated in the netlist.

27. An article of manufacture comprising a computer readable medium bearing a program code embodied therein for performing a method for forming a structural similarity group from a netlist of an integrated circuit, the method comprising:

taking a netlist representation of components forming all or part of an integrated circuit;

forming groups of components within the netlist which have at least a selected degree of structural similarity between each other;

making a structural similarity group which includes those groups of components identified as having at least the selected degree of structural similarity;

performing an initial relative placement of the groups of components;

reducing wire lengths between components of initial relative placement; and adding to the relative placement those components from the netlist which were not included in the groups of components.

28. An article of manufacture according to claim 27 wherein the netlist representation includes all of the components forming integrated circuit.

29. An article of manufacture according to claim 27 wherein the netlist representation includes a portion of the components forming integrated circuit.

30. An article of manufacture according to claim 27 wherein each group of components formed includes at least two components.

31. An article of manufacture according to claim 27 wherein each group of components formed includes at least three components.

32. An article of manufacture according to claim 27 wherein each group of components formed includes at least four components.

33. An article of manufacture according to claim 27 wherein the selected degree of structural similarity is at least 10% similarity in bus line and control line connectivity between components of the group.

34. An article of manufacture according to claim 27 wherein the selected degree of structural similarity is at least 20% similarity in bus line and control line connectivity between components of the group.

35. An article of manufacture according to claim 27 wherein the selected degree of structural similarity is at least 25% similarity in bus line and control line connectivity between components of the group.

36. An article of manufacture according to claim 27 wherein the selected degree of structural similarity is at least 33% similarity in bus line and control line connectivity between components of the group.

37. An article of manufacture according to claim 27 wherein the selected degree of structural similarity is at least 50% similarity in bus line and control line connectivity between components of the group.

38. An article of manufacture according to claim 27 wherein the selected degree of structural similarity is at least 66% similarity in bus line and control line connectivity between components of the group.

39. An article of manufacture according to claim 27 wherein the selected degree of structural similarity is at least 75% similarity in bus line and control line connectivity between components of the group.

* * * * *

UNITED STATES PATENT AND TRADEMARK OFFICE

CERTIFICATE OF CORRECTION

PATENT NO. : 6,584,605 B1
DATED : June 24, 2003
INVENTOR(S) : Sharon Zohar

It is certified that error appears in the above-identified patent and that said Letters Patent is hereby corrected as shown below:

Title page,
Item [12], Inventor, replace "Zahar" with -- Zohar --.
Item [75], Inventor, replace "Zahar" with -- Zohar --.

Signed and Sealed this

Twelfth Day of August, 2003

JAMES E. ROGAN
*Director of the United States Patent and Trademark Office*